United States Patent [19]
Ashley et al.

[11] Patent Number: 5,245,261
[45] Date of Patent: Sep. 14, 1993

[54] TEMPERATURE COMPENSATED OVERCURRENT AND UNDERCURRENT DETECTOR

[75] Inventors: Donald J. Ashley; Mark K. DeMoor, both of Endicott, N.Y.

[73] Assignee: International Business Machines Corporation, Armonk, N.Y.

[21] Appl. No.: 782,211

[22] Filed: Oct. 24, 1991

[51] Int. Cl.$^5$ .................... H01L 29/73; H01L 23/58
[52] U.S. Cl. .................... 318/558; 361/87; 257/467
[58] Field of Search .............. 361/18, 19, 23, 30, 361/31, 87, 152, 154, 401, 404, 409, 78, 79, 93, 100, 101; 357/28; 340/664; 324/500; 318/558

[56] References Cited

U.S. PATENT DOCUMENTS

| | | | |
|---|---|---|---|
| 3,479,593 | 11/1969 | Dissing et al. | 324/123 |
| 3,603,979 | 9/1971 | Kosakowski | 340/347 |
| 3,671,814 | 6/1972 | Dick | 317/123 |
| 3,678,298 | 7/1972 | Dyer | 307/270 |
| 3,737,736 | 6/1973 | Stampfli | 317/154 |
| 3,932,810 | 1/1976 | Kohler et al. | 324/126 |
| 4,032,830 | 6/1977 | Buonavita | 363/25 |
| 4,194,147 | 3/1980 | Payne et al. | 323/17 |
| 4,266,182 | 5/1981 | Boaos et al. | 323/267 |
| 4,266,261 | 5/1981 | Streit | 361/154 |
| 4,295,177 | 10/1981 | Woodhouse et al. | 361/154 |
| 4,300,508 | 11/1981 | Streit et al. | 123/490 |
| 4,308,576 | 12/1981 | Clark, Jr. | 363/56 |
| 4,309,650 | 1/1982 | Boros et al. | 323/283 |
| 4,323,845 | 4/1982 | Leach | 323/224 |
| 4,410,935 | 10/1983 | Dang | 363/37 |
| 4,428,015 | 1/1984 | Nesler | 361/18 |
| 4,428,016 | 1/1984 | Brasfield | 361/18 |
| 4,433,370 | 2/1984 | Karadsheh et al. | 363/124 |
| 4,449,081 | 5/1984 | Doemen | 318/254 |
| 4,494,134 | 1/1985 | Wildi et al. | 357/43 |

(List continued on next page.)

FOREIGN PATENT DOCUMENTS 2074819  4/1981  United Kingdom .

OTHER PUBLICATIONS

International Rectifier, HEXFET Power MOSFETs Die Outlines, p. 168.

The PCIM Technology, Jul. 1990, pp. 10-13, "Cell-Based ASICs Allow User-Designed Intelligent Power Devices", Sam Davis/PCIM Sr. Editor.

IBM TDB vol. 31, No. 5, Oct. 1988, pp. 85-86, "Stepper Motor Driver Control", J. A. Bartlett et al.

IBM TDB vol. 28, No. 3, Aug. 1985, pp. 1193-1195, "Combined Switch-Mode Power Amplifier and Supply", R. D. Commander.

*Primary Examiner*—Bentsu Ro
*Attorney, Agent, or Firm*—Arthur J. Samodovitz

[57] ABSTRACT

A temperature compensated overcurrent and/or undercurrent detector monitors current through a solenoid or other load and signals when the load current exceeds an upper limit or falls below a lower limit. Such a signal may indicate a failure of another circuit which supplies the load current via a load transistor. This other circuit which supplies the load current is temperature compensated, and likewise the detector is temperature compensated so it can be set to signal an overcurrent or undercurrent condition when the load current varies a small amount from a predetermined range. The load transistor has an on-resistance which passes the load current and varies with temperature. The temperature compensation for the detector is provided in part by two pilot transistors which are integrated with the load transistor such that as the load transistor heats-up due to the load current passing through the on-resistance, the pilot transistors heat-up due to heat conduction from the load transistor. Each pilot transistor also has an on-resistance which varies proportionally or similarly to the on-resistance of the load transistor. A current source is coupled to the on-resistance of each pilot transistor to generate reference voltages above and below the acceptable range of voltages sensed by the sensor representing an acceptable range of load currents.

6 Claims, 14 Drawing Sheets

U.S. PATENT DOCUMENTS

| | | | |
|---|---|---|---|
| 4,513,241 | 4/1985 | Bowman | 323/285 |
| 4,520,420 | 5/1985 | Ariyoshi et al. | 361/154 |
| 4,533,836 | 8/1985 | Carpenter et al. | 307/11 |
| 4,551,779 | 11/1985 | Murakami et al. | 361/86 |
| 4,605,983 | 8/1986 | Harvey | 361/154 |
| 4,667,117 | 5/1987 | Nebgen et al. | 307/154 |
| 4,680,667 | 7/1987 | Petrie | 361/154 |
| 4,720,762 | 1/1988 | Estes | 361/154 |
| 4,729,056 | 3/1988 | Edwards et al. | 361/153 |
| 4,764,840 | 8/1988 | Petrie et al. | 361/154 |
| 4,777,579 | 10/1988 | Jahns et al. | 363/98 |
| 4,779,039 | 10/1988 | Baker | 324/130 |
| 4,783,690 | 11/1988 | Walden et al. | 357/23.4 |
| 4,820,968 | 4/1989 | Wrathall | 323/316 |
| 4,879,641 | 11/1989 | Rossi et al. | 363/98 |
| 4,896,254 | 1/1990 | Bennett et al. | 363/50 |
| 4,897,557 | 1/1990 | Krause | 307/134 |
| 4,902,957 | 2/1990 | Cassani et al. | 323/222 |
| 4,907,121 | 3/1990 | Hrassky | 361/154 |
| 4,925,156 | 5/1990 | Stoll et al. | 251/129.01 |
| 4,930,040 | 5/1990 | Binarsch et al. | 361/154 |
| 4,944,281 | 7/1990 | Suquet | 123/644 |
| 4,949,215 | 8/1990 | Studtmann et al. | 361/154 |
| 4,953,056 | 8/1990 | Yakuwa et al. | 361/154 |
| 4,967,309 | 10/1990 | Hoffman | 361/160 |
| 4,970,456 | 11/1990 | Holcomb | 324/95 |
| 4,978,865 | 12/1990 | Hartmann et al. | 307/140 |
| 4,989,116 | 1/1991 | Gruner et al. | 361/154 |
| 5,018,041 | 5/1991 | Szepesi | 361/18 |
| 5,126,659 | 6/1992 | Edwards | 324/158 R |
| 5,159,516 | 10/1992 | Fujihira | 361/18 |
| 5,179,493 | 1/1993 | Imanishi | 361/91 |

TEMPERATURE COMPENSATED OVERCURRENT AND UNDERCURRENT DETECTOR

BACKGROUND

The invention relates generally to circuits for controlling current through a solenoid, motor or other load. The invention relates more specifically to a circuit for monitoring the load current to detect overcurrent and undercurrent conditions.

The following patent applications filed herewith have a common Detailed Description:

U.S. Ser. No. 07/782,218 filed on Oct. 24, 1991 by D. J. Ashley, M. K. Demoor and P. W. Graf, entitled "Temperature Compensated Circuit For Controlling Load Current"

U.S. Ser. No. 07/782,833 filed on Oct. 24, 1991 by D. J. Ashley, entitled "Temperature Monitoring Pilot Transistor"

Solenoids and motors are used for various purposes, and may require carefully controlled load current at one or more levels. For example, some solenoids are used to drive print hammers in impact printers and require two controlled levels of drive current, an initial "activation" current and a subsequent hold current. The initial "activation" current is relatively large to overcome the inertia and static friction of the moving parts coupled to the solenoid, and the subsequent "hold" current is relatively low to limit the contact force or holding force of these moving parts.

U.S. Pat. No. 4,764,840 discloses a control circuit for a solenoid which circuit provides two levels of load current. A resistor is located in series with the solenoid, and the voltage across the resistor is supplied to the positive input of one comparator and the negative input of another comparator. The other inputs to the comparators are provided by a three resistor voltage divider which divides a reference voltage. Thus, the two comparators provide a window to control the voltage which drives the load current. While the reference voltage which drives the voltage divider is fixed, a one-shot injects extra current into the voltage divider during the activation current phase to raise the window for controlling the activation current.

In precision applications, it is vital to carefully control the drive current at each level particularly in view of temperature effects. Typically, there is a load transistor which conducts the load current, and the series on-resistance of the load transistor increases as the load transistor conducts because the conducted current heats the load transistor. Consequently, the changing on-resistance of the load transistor will effect the drive current. There are also other factors which affect the load current. As a result, some form of feedback has been utilized to continuously control the source voltage to compensate for such changes in the series on-resistance of the load transistor and the other factors. For example, a small resistor has been placed in series with the coil, and the voltage across the resistor used to measure the drive current. This measurement in turn is used to control the drive current. This technique has the disadvantages of power dissipation and imprecision due to the variation in resistance of the series resistor with temperature. A more recent (prior art) technique utilizes a "drain pilot" transistor which is a scaled version of the load transistor. For example, the load transistor is made of thousands of identical transistors in parallel and the pilot transistor has the same structure as the individual transistors of the load transistor and the size of hundreds of the individual transistors in parallel. The drain pilot transistor and the load transistor are both integrated into the same "chip" and are located adjacent to each other, but the drain pilot transistor does not pass any of the load current. Nevertheless, as the load transistor heats-up due to the load current, the pilot transistor also heats-up and the on-resistance of each changes proportionally. A constant current source feeds the pilot transistor and therefore, develops a voltage which is proportional to the ideal load current. The voltage across the pilot transistor is then compared to a voltage sensed across the load transistor. If the second voltage is greater than the reference voltage then the load is disconnected from the power source for a predetermined period. During this period, the load current will drop according to an RL time constant of the load circuit such that the sensed voltage falls below the reference voltage. Then, the power source is re-applied to the load to cause the load current to rise, and the cycle is repeated. Thus, the load current is controlled. While such control is accurate enough for many applications, the average load current can vary despite the accuracy of the reference voltage. This is because the amount of decay of the load current when the load is disconnected from the power supply depends on the resistance of the series load circuit and this resistance can neither be designed with precision nor kept constant with changes in temperature.

In precision applications, it is also desirable to monitor the drive currents at each level to determine if the drive current rises above or falls below an acceptable range at each level. Such a condition is called an overcurrent or undercurrent condition, respectively, and indicates that the controller for the drive current is malfunctioning and some corrective action should be taken.

Previously, it was known to establish two fixed reference voltage levels which bracket the acceptable voltage range at each level used to drive the solenoid. These two fixed reference voltages were compared to the corresponding load circuit voltages to detect overcurrent and undercurrent conditions at each level. In this prior art technique, the fixed voltage levels were not temperature compensated. If such a technique were used in conjunction with a temperature compensated load transistor, then the "window" between the two fixed voltage levels would have to be wide to accommodate the variations in the voltage levels which are sensed from the load circuit. In such a case, the overcurrent and undercurrent detector would not be sensitive enough for some precision applications.

Accordingly, a general object of the present invention is to provide a temperature compensated overcurrent and undercurrent detector.

A more specific object of the present invention is to provide a detector of the foregoing type which can be used with a drive circuit which utilizes a pilot transistor to provide temperature compensation for the voltage which drives the load current.

Another specific object of the present invention is to provide a detector of the foregoing type which can provide the detection window for two levels of drive current with a minimum amount of circuitry.

Still another object of the present invention is to provide a detector of the foregoing types which enables the windows to be moved by changing external parts to the integrated circuit and which requires a minimum number of changed parts and I/O pins to interconnect to the external parts.

SUMMARY

The invention resides in a temperature compensated overcurrent and/or undercurrent detector for monitoring current through a solenoid or other load and signalling when the load current exceeds an upper limit or falls below a lower limit. Such a signal may indicate a failure of another circuit which supplies the load current via a load transistor. This other circuit which supplies the load current is temperature compensated, and likewise the detector is temperature compensated so it can be set to signal an overcurrent or undercurrent condition when the load current varies a small amount from a predetermined range.

The load transistor has an on-resistance which passes the load current and varies with temperature. The temperature compensation is provided in part by a pilot transistor which is integrated with the load transistor such that as the load transistor heats-up due to the load current passing through the on-resistance, the pilot transistor heats-up due to heat conduction from the load transistor. The pilot transistor also has an on-resistance which varies proportionally or similarly to the on-resistance of the load transistor as the load transistor heats-up due to the load current. The detector also includes a sensor to sense a voltage across the on-resistance of the load transistor corresponding to the load current. A current source is coupled to the on-resistance of the pilot transistor to generate a reference voltage either above or below the acceptable range of voltages sensed by the sensor representing an acceptable range of load currents. Because the on-resistance of the pilot transistor tracks the on-resistance of the load transistor, the reference voltage is temperature compensated and tracks the acceptable range of load currents. A comparator receives as inputs the sensed voltage across the load transistor and the reference voltage and provides the overcurrent or undercurrent signal.

According to features of the present invention, two pilot transistors and respective current sources are provided to yield reference voltages for both overcurrent and undercurrent conditions at one acceptable range of load currents, and two comparators are provided to compare each reference to the sensed voltage. Also, two current sources for each pilot transistor and a respective multiplexor are provided to provide overcurrent and undercurrent reference voltages for two acceptable ranges of drive current such as a relatively high activation current and a relatively low hold current for a solenoid load.

According to another feature of the invention, the detector is coupled to a motor coil and senses when the magnitude of the current falls below a predetermined level, for example, near zero. This indicates when commutation occurs because during commutation, the direction of current though the motor coil is reversed and at an instant is equal to zero. This signal can also be used to determine the speed of the motor based on the time between successive undercurrent signals representing successive commutations.

BRIEF DESCRIPTION OF THE FIGURES

FIG. 14 also illustrates reference voltages generated by an over current and under current detector for the controller of FIG. 13 and other controllers.

DETAILED DESCRIPTION OF THE PREFERRED EMBODIMENTS

Figure 1:
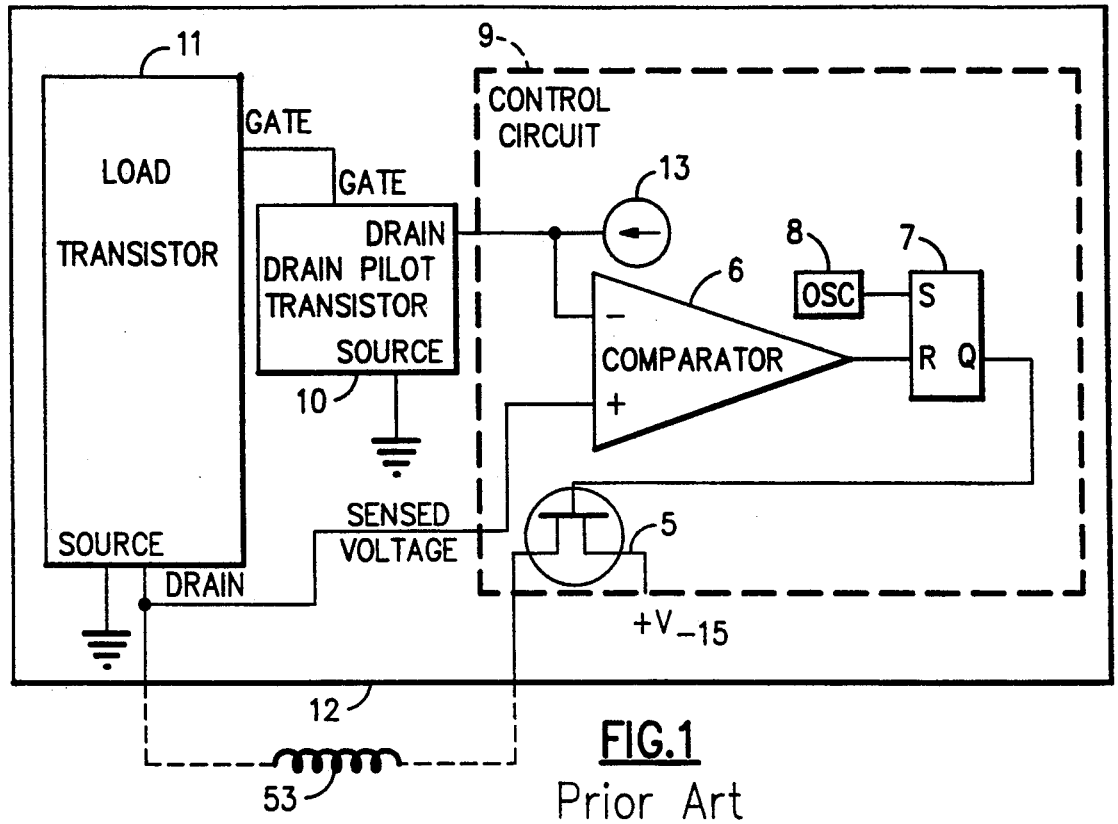
FIG. 1 is a diagram of a load transistor, pilot transistor, and control circuitry and their semiconductor layout according to the prior art.

Referring now to the drawings in detail wherein like reference numerals indicate like elements throughout the several views, FIG. 1 illustrates a drain pilot transistor generally designated 10 and associated load transistor 11 and control circuitry 9 according to the Prior Art. Drain pilot transistor 10 and load transistor 11 are both integrated into a silicon chip 12 adjacent to each other. The load transistor 11 and the pilot transistor 10 are MOSFET devices. By way of example, load transistor 11 comprises hundreds of thousands of individual MOSFET transistors which are connected in parallel, and pilot transistor 10 is a scaled model of the load transistor and has a size equal to hundreds of the individual transistors of the load transistor connected in parallel. Control circuitry 9 is also integrated into the same integrated circuit or "chip" 12 and controls the current to a load 53.

The control circuitry uses the pilot transistor 10 to accurately control the load current in the following manner. A constant current source 13 supplies an on-resistance (drain to source path) of the pilot transistor 10 to develop a reference voltage for comparison (by comparator 6) to a voltage sensed at the drain of load transistor 11. When the sensed voltage rises above the reference voltage, the comparator 6 resets a flip flop 7 which turns-off a transistor 5 and thereby disconnects a power supply 15 from the load for a predetermined period determined by the frequency of an oscillator 8. After this predetermined period, if the sensed voltage is below the reference voltage, the oscillator sets flip flop 7 and thereby re-connects the power supply 15 to the load until the sensed voltage exceeds the reference voltage and the cycle is repeated. Consequently, the load current is maintained approximately constant except for the aforesaid fluctuations. It should be noted that because these fluctuations depend on the LR time constant of the load 53 and series circuitry, and the time constant may vary with temperature, the average load current is not entirely controllable. Although this level of control of the average load current is more than adequate for many applications, some high precision applications require greater control of the average load current.

Pilot transistor 10 provides substantial temperature compensation to the reference voltage in the following manner (although even this temperature control cannot control the aforesaid fluctuations). Because the pilot transistor 10 is located adjacent to the load transistor 11 and both are part of the same chip 12, heat generated as a result of load current passing through the load transistor 11 conducts through the chip to pilot transistor 10. As a result, the pilot transistor heats-up to nearly the same junction temperature as the load transistor. The heat increases the on-resistance from the drain to source of the load transistor 11 and due to the heat conduction, proportionally increases the on-resistance from the drain to source of the pilot transistor 10. Therefore, the reference voltage developed across the pilot transistor increases proportionally to the sensed voltage developed across the load transistor due to increases in temperature. Thus, the reference voltage is temperature compensated because it rises as does the sensed voltage due to proportional increases in on-resistances.

Figure 2:
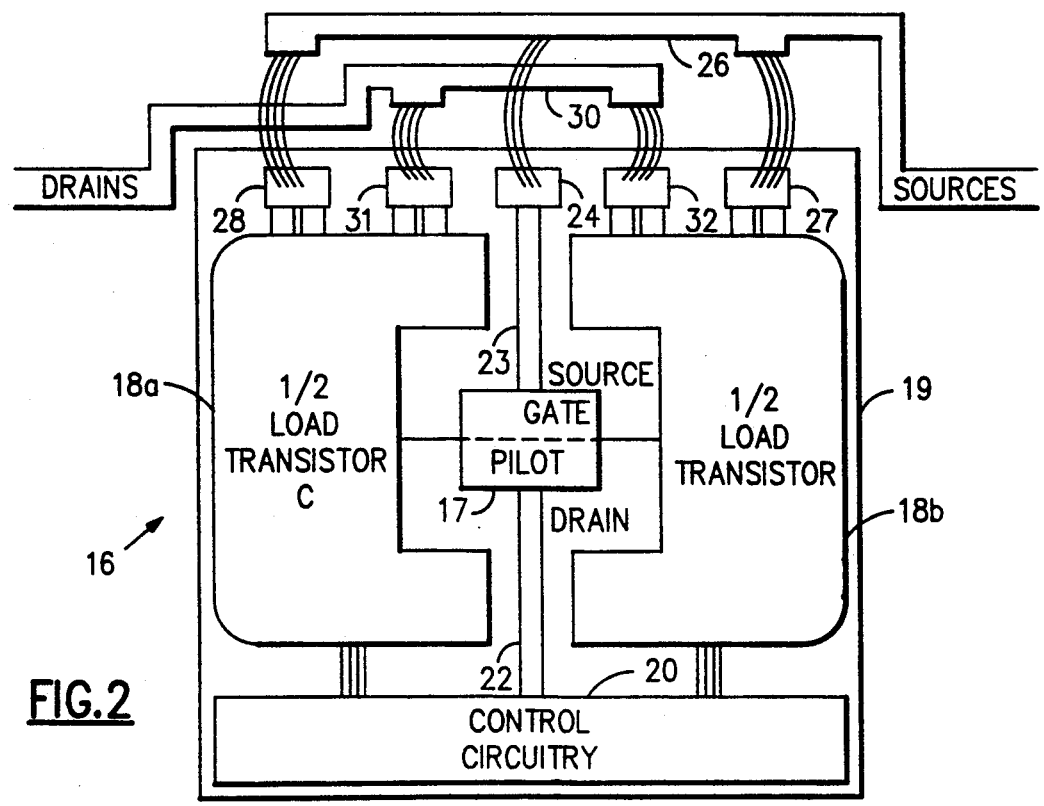
FIG. 2 is a diagram of a load transistor, pilot transistor and control circuitry and their semiconductor layout.

FIG. 2 illustrates a circuit 16 which embodies a MOSFET drain pilot transistor 17 and a larger, MOSFET load transistor 18a,b which are configured and laid-out to optimize the temperature tracking by the pilot transistor of the load transistor. The load transistor is physically divided into two halves 18a and 18b on a silicon chip 19 by the pilot transistor 17, a conductor 22 connected between control circuitry 20 and the drain of the pilot transistor, and a conductor 23 connected between an I/O pad 24 (which is grounded) and the source of pilot transistor 17. Nevertheless, the load transistor halves 18a and 18b substantially surround pilot transistor 17, and the pilot transistor heats to approximately the same temperature as the load transistor due to heat conduction from the load transistor through the silicon chip 19. The load transistor halves 18a and 18b are electrically connected to each other by a common source conductor 26 (via I/O pads 27 and 28), and a common drain conductor 30 (via I/O pads 31 and 32). Silicon chip 19 includes a metal layer 44 (FIG. 4) on the back side to conduct the heat to a heat sink, but this metal layer also serves to conduct the heat from the load transistor to the pilot transistor. It should also be noted that the presence of the pilot transistor between the load transistor halves also serves to spread the load transistor apart to a small degree and therefore, de-concentrate the heating to a small degree.

A current source (illustrated below in several embodiments of the control circuitry) supplies the on-resistance of the pilot transistor, and a resultant reference voltage is compared to a voltage sensed at the drain of the load transistor. Tests have indicated close tracking (+ or −4%) between the reference voltage and the sensed voltage corresponding to the ideal load current over a wide range of temperatures. This compares to a variation of + or −14% for the prior art arrangement illustrated in FIG. 1.

Figure 3:
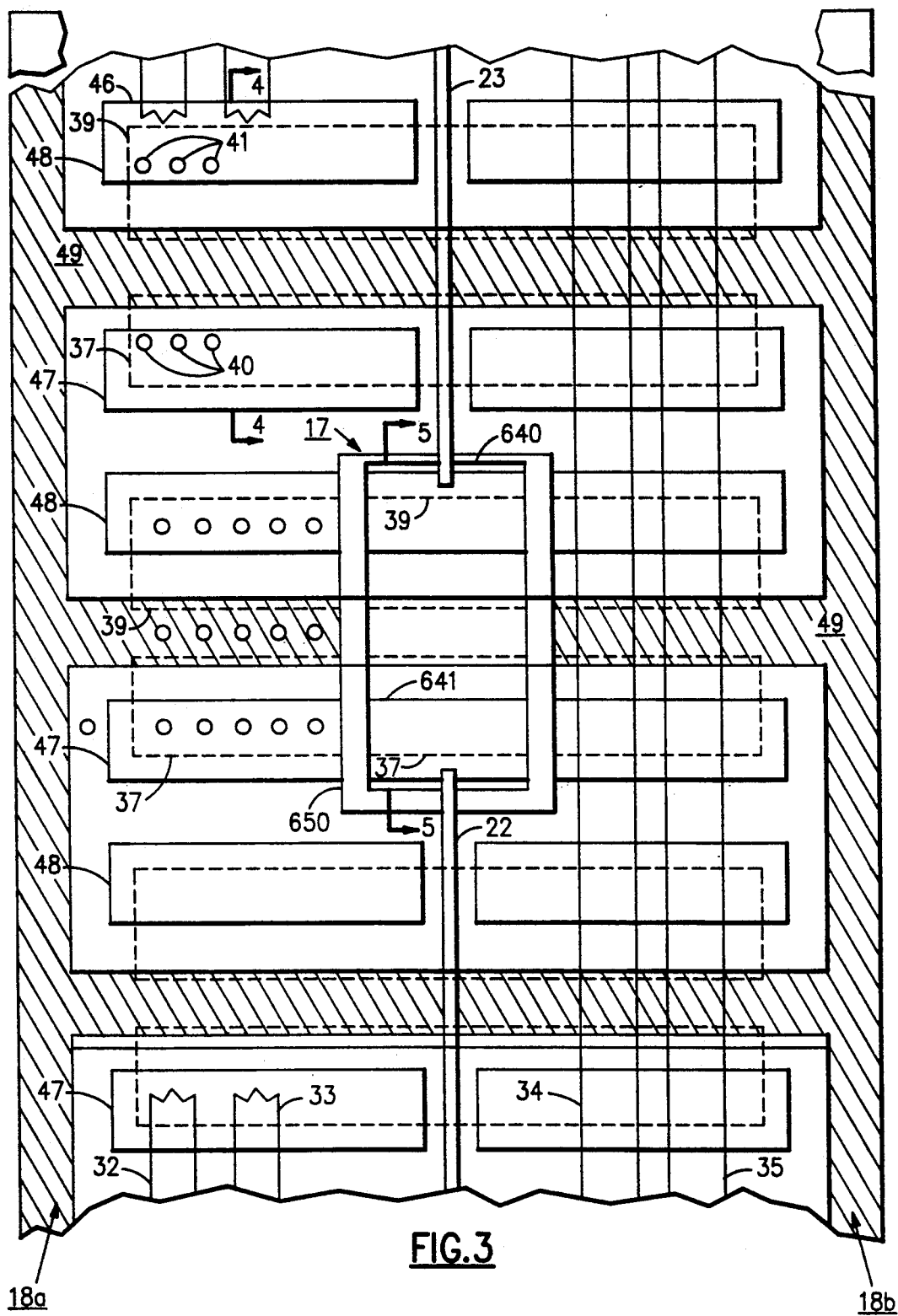
FIG. 3 is a more detailed, top view of a portion of the load transistor and pilot transistor of FIG. 2.
Figure 4:
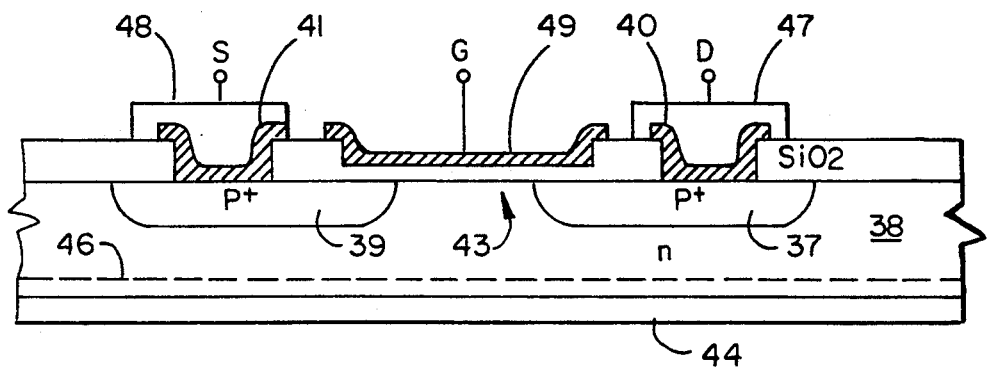
FIG. 4 is a cross-sectional view of a portion of the load transistor of FIG. 2.

FIG. 3 illustrates a top view of the load transistor 18a,b and pilot transistor 17 in more detail. As noted above, both devices utilize MOSFET technology in this embodiment of the present invention. FIG. 4 illustrates a cross-section of any of the individual transistors within the load transistor 18a,b. Each of the individual transistors of the load transistor comprises a P+ region 37 for the drain which is diffused into an N type substrate 38, and another P+ region 39 for the source which is also diffused into N type substrate 38. Spotlike metal contacts 40 and 41 are provided for the drain and source, respectively. Each of the individual transistors in a row is formed from strips of P+ diffused regions for the drain and source which have been separated (in effect) by the metal contacts 40 and 41 although there is no physical separation between the diffused P+ regions 37 and 39. A continuous polysilicon strip 49 for each row of transistors is provided to apply a gate voltage for a channel 43. While the polysilicon strip is not nearly as conductive as metal, the gate does not conduct current (because this is a field effect transistor) so the polysilicon is an adequate conductor. Polysilicon provides a more complete covering over the gate than does metal. On the opposite side of the substrate 38 is metal layer 44 which serves to conduct some of the heat dissipated in the load transistor to a heat sink (not shown) and also provide a connection to a ground plane.

By way of example, there are 244,946 individual transistors within load transistor 18. Metal conductor strips 47 and 48 in a metal one layer overlay the metal contacts 40 and 41 for the drains and sources, respectively for all of the transistors within each row in each half of the load transistor. Thus, metal conductor strips 47 and 48 and polysilicon strip 49 interconnect in parallel all of the transistors within each row of each half of the load transistor. Metal conductor strips 32 and 35 in a metal two layer interconnect the drains of the different rows, and metal conductor strips 33 and 34 interconnect the sources of the different rows. Metal contacts (not shown) interconnect the respective metal one and metal two conductors. As noted above, the conductors 26 and 30 interconnect the sources and drains, respectively of the load transistor halves. The gates of the two halves are also interconnected by the polysilicon strips 49 which extend from the ends of the rows.

Figure 5:
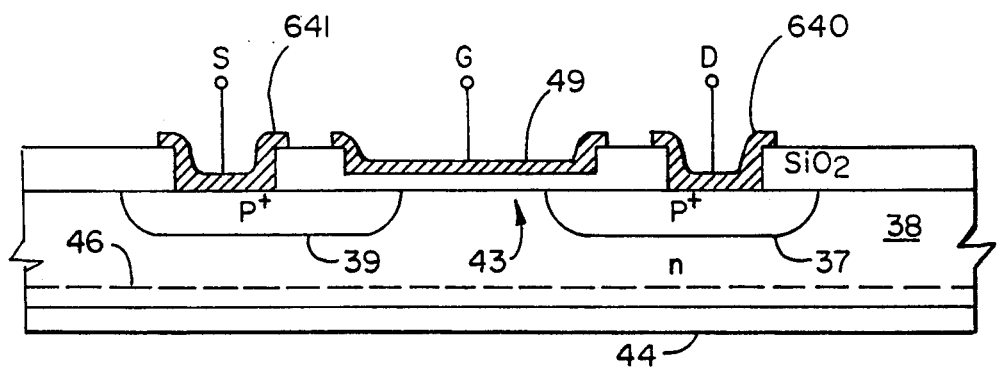
FIG. 5 is a cross-sectional view of the pilot transistor of FIG. 2.

FIG. 5 illustrates in cross-section the pilot transistor 17. By way of example, the pilot transistor is made of a single transistor whose size equals that of 109 of the individual transistors of the load transistor side by side. The semiconductor layers 37, 38, 39 and 43 and the polysilicon gate strip 49 over the channel 43 are the same in the pilot transistor as in the individual transistors of the load transistor except that in the pilot transistor 17 there is no attempt to divide the pilot transistor into individual transistors. Due to the small size of the pilot transistors such divisions are not necessary for good performance. Therefore, instead of the spotlike metal contacts 40 and 41 of the individual transistors of the load transistor, pilot transistor 17 comprises metal strip conductors 640 and 641 which overlay the drain diffusion 37 and source diffusion 39, respectively along the entire length of the drain and source diffusions. Also, a trench isolation region 650 entirely surrounds the pilot transistor to isolate it from the load transistor.

It should be noted that the present invention does not extend to the actual silicon technology (i.e. materials, dimensions) of the load transistor 18a,b or the pilot transistor 17, and many diverse technologies will suffice. The technologies illustrated in FIGS. 3, 4 and 5 disclose the basic structure and arrangement of the load transistor which surrounds a single pilot transistor. However, FIGS. 6–9 disclose a better layout and technology for fabricating the load and pilot transistor with a DMOS structure. For further details of such DMOS technology, reference can be made to Harris Power ASIC 2000 Library book section 3.11 which section is hereby incorporated by reference as part of the present disclosure. For commercialization, Harris Semiconductor Inc. was engaged by the assignee of this patent application to fabricate the foregoing pilot transistor and load transistor arrangement using Harris' proprietary "PASIC 1-A" technology (which can be ordered by the general public). This PASIC 1-A technology also utilizes DMOS structure for the load and pilot transistor.

Figure 6:
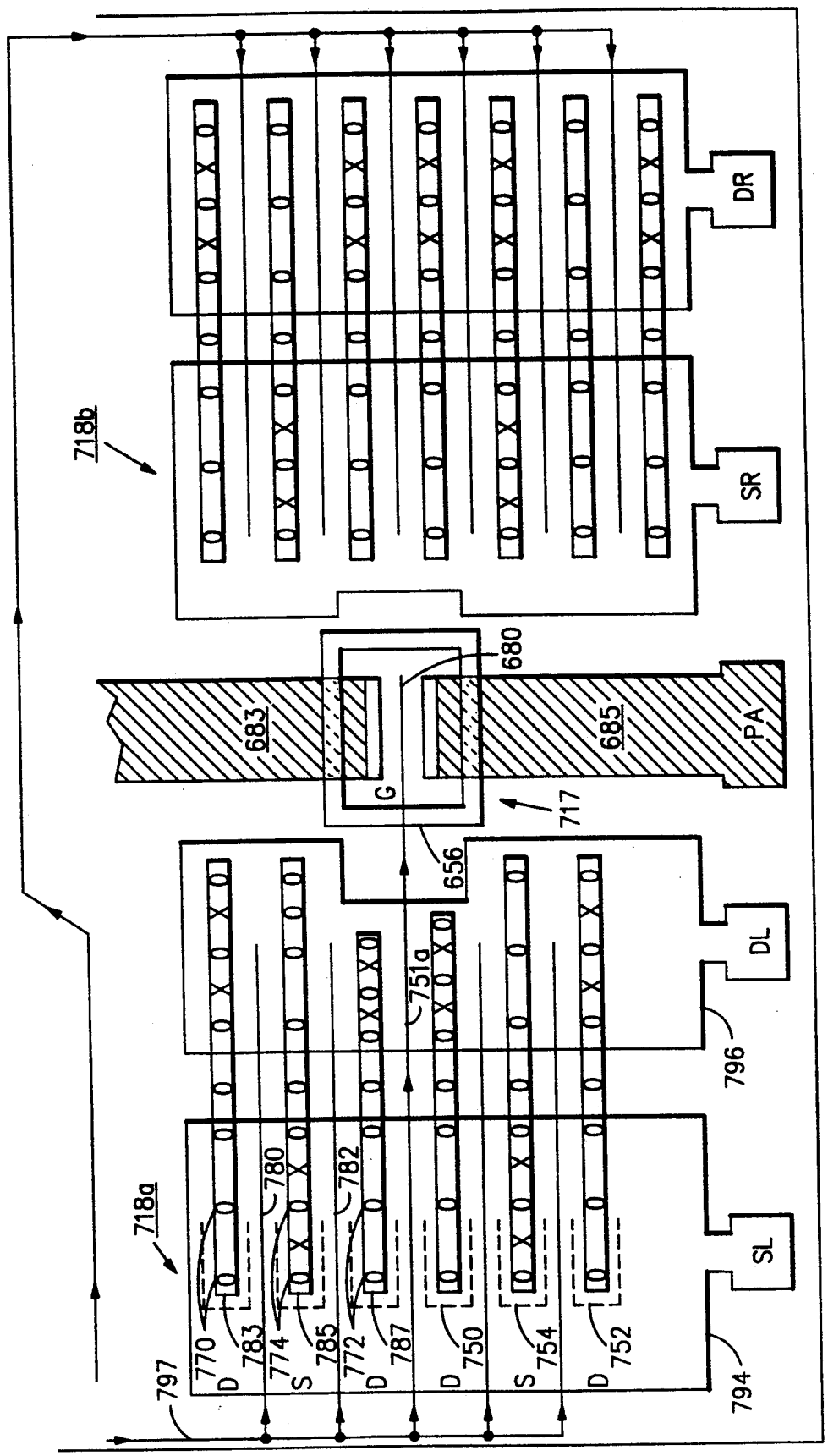
FIG. 6 is a detailed, top view of a portion of a load transistor and pilot transistor of an alternate embodiment of the circuit of FIG. 2.
Figure 7:
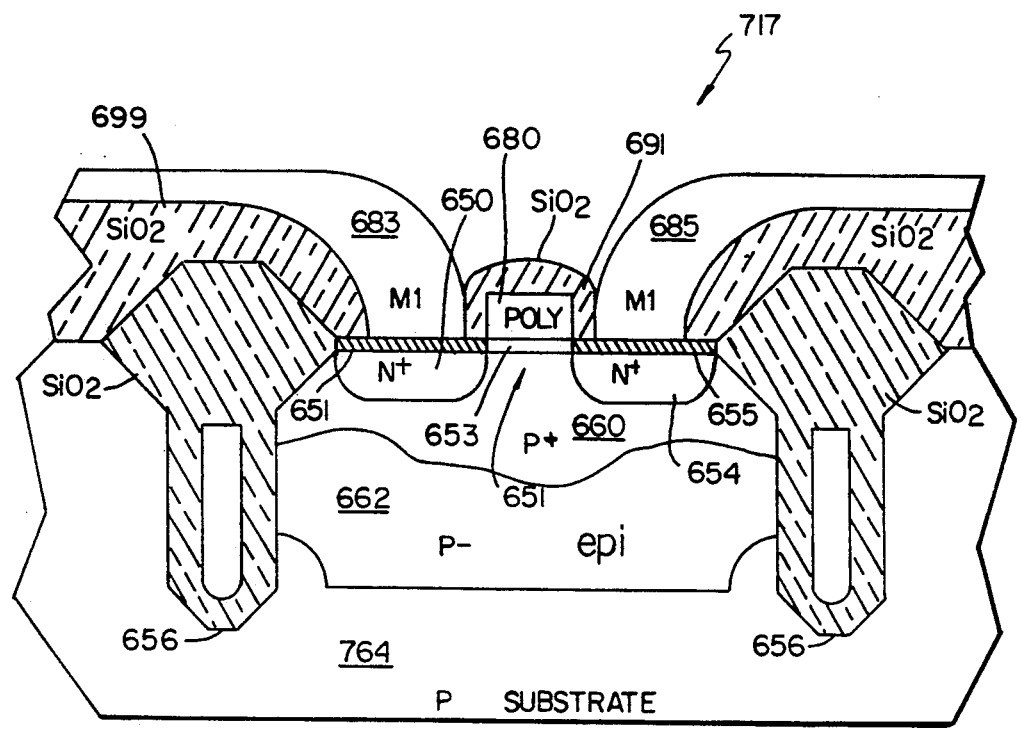
FIG. 7 is a cross-sectional view of a portion of the pilot transistor of FIG. 5.

FIG. 6 is a top view of a load transistor 718a,b (collectively referenced as load transistor 718) and imbedded drain pilot transistor 717 according to another, better technology than that of FIGS. 3–5. FIG. 7 further illustrates in cross-section the pilot transistor 717. Pilot transistor 717 comprises a drain 650, a source 654, and a gate region 651. Drain 650 comprises an elongated N+ diffused region and likewise, source 654 comprises an elongated N+ diffused region. Both the drain and source are diffused into a P+ layer 660 which includes the channel region 651. The P+ layer 660 is diffused into a P− epitaxial layer 662 which is grown onto a P substrate 764. A Thinox layer 653 comprised of a 500 angstroms thick layer of silicon dioxide overlays the exposed surface of channel region 651 for the purpose of isolating the underlying P+ channel region from the polysilicon gate conductor.

Conductive titanium silicide strips 651 and 655 overlay the drain diffusion 650 and the source diffusion 654, respectively along the entire length of each diffusion to provide a good electrical contact to the diffusions. A metal strip conductor 683 overlays the titanium silicide strip 683 along the entire length of strip 683 to provide a connection for the drain of the pilot transistor 717. A metal strip conductor 685 overlays the titanium silicide strip 655 along the entire length of strip 685 to provide a connection for the source of pilot transistor 717. A polysilicon conductor strip 680 overlays the Thinox strip 653 to provide a gate contact for controlling current through the channel between source and drain. Isolating trenches 656 (comprised of silicon dioxide) surround the pilot transistor 717. The result is an elongated pilot transistor which is a scaled model of the load transistor 718.

Figure 8:
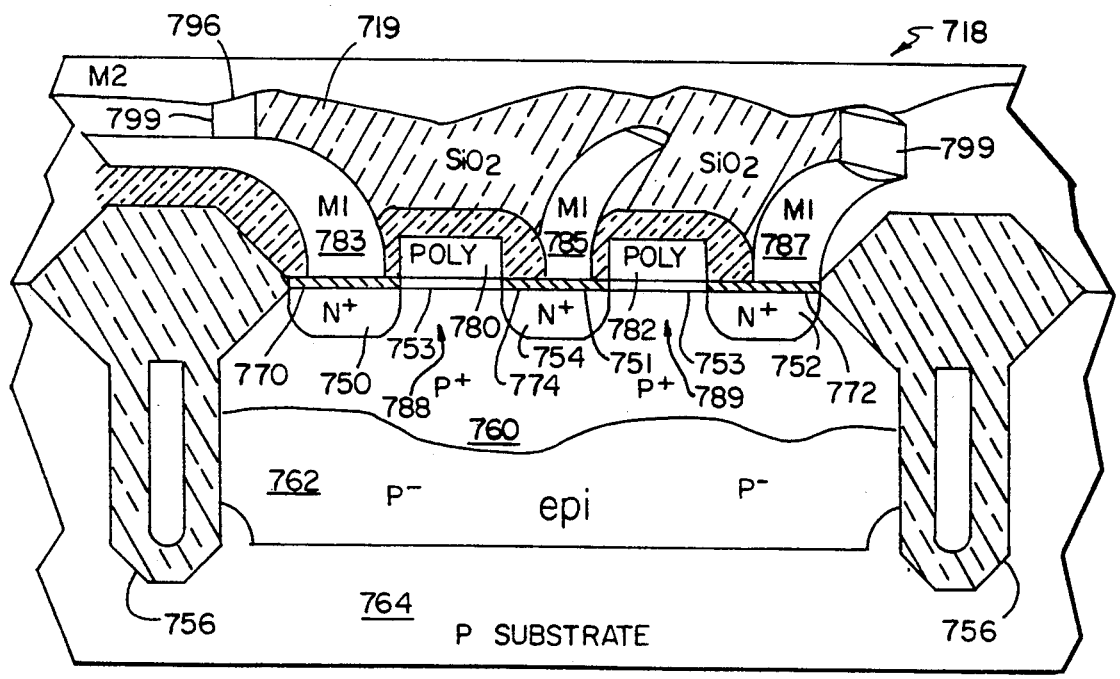
FIG. 8 is a cross-sectional view of a portion of the load transistor of FIG. 5.

FIG. 8 further illustrates a portion of the load transistor 718 in cross-section. In the load transistor 718, two drains 750 and 752 straddle a common source 754 to yield two transistors yet conserve "real estate". In the illustrated embodiment, each of the drains and source comprises an N+ region which is diffused into a P+ layer 760. P+ layer 760 is diffused into a P− epitaxial layer 762 which is grown onto a P substrate 764. Portions 788 and 789 of the P+ region 760 between drain diffusions 750 and 752 and the source, respectively, form the channel regions for the two transistors. Thinox layers 753 comprised of a 500 angstroms thick layer of silicon dioxide overlay the exposed surfaces of channel regions 788 and 789 for the purpose of isolating the gate conductor from the channel region.

Each of the diffused drains and source is elongated (and shared by a multiplicity of individual transistors which collectively form load transistor 718 as described below). Spotlike titanium silicide regions 770, 772 and 774 form spotlike electrical contacts to the drain diffused regions 750 and 752 and the source diffused region 754, respectively. These spotlike regions 770, 772 and 774 effectively divide the rows of drain and source diffusions into individual transistors to create parallel conduction paths for conducting the high load currents evenly.

Figure 9:
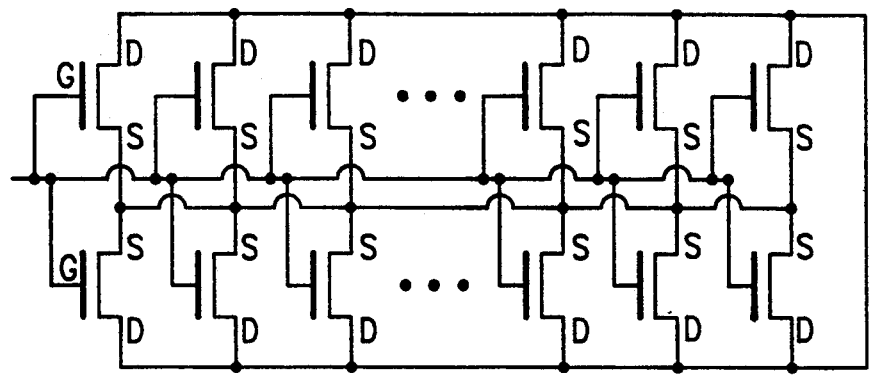
FIG. 9 is a schematic diagram of an electrical circuit formed by a portion of the load transistor of FIG. 5.

All of the spotlike contacts 770 in each row of transistors in the left half 718a of the load transistor is connected to a respective, elongated metal strip conductor 783 in a metal one layer. Similarly, all of the spotlike contacts 772 in each row of transistors in the left half 718a of the load transistor is connected to a respective, elongated metal strip conductor 787 in the metal one layer. Similarly, all of the spotlike contacts 774 in each row of transistors in the left half 718 of the load transistor is connected to a respective, elongated metal strip conductor 785 in the metal one layer. Continuous polysilicon gate strips 780 and 782 provide gate contacts between drain 750 and source 754 and between drain 752 and source 754, respectively. The metal one layer and a metal two layer are separated from each other by an insulating layer 779 of silicon dioxide. Isolating trenches 756 (comprised of silicon dioxide) isolate this double row of transistors from the adjacent double rows illustrated in FIG. 6. The result of the aforesaid design is double rows of individual load transistors with each double row sharing a common source. The individual transistors within each double row are connected in parallel as illustrated in FIG. 9.

A metal strip conductor 796 in the metal two layer overlays all the metal strip conductors 783 and 787 within the load transistor half 718a, (via metal two to metal one metal contacts 799), and similarly a metal strip conductor 794 in the metal two layer overlays all the metal strip conductors 785 within the load transistor half 718a. These metal two layer conductors 794 and 796 interconnect the drains and sources of the rows of transistors in parallel with each other. To interconnect the gates of the double rows of transistors, the continuous polysilicon strips 780 and 782 are joined to each other by an integral polysilicon portion 797 between the strips.

Figure 10:
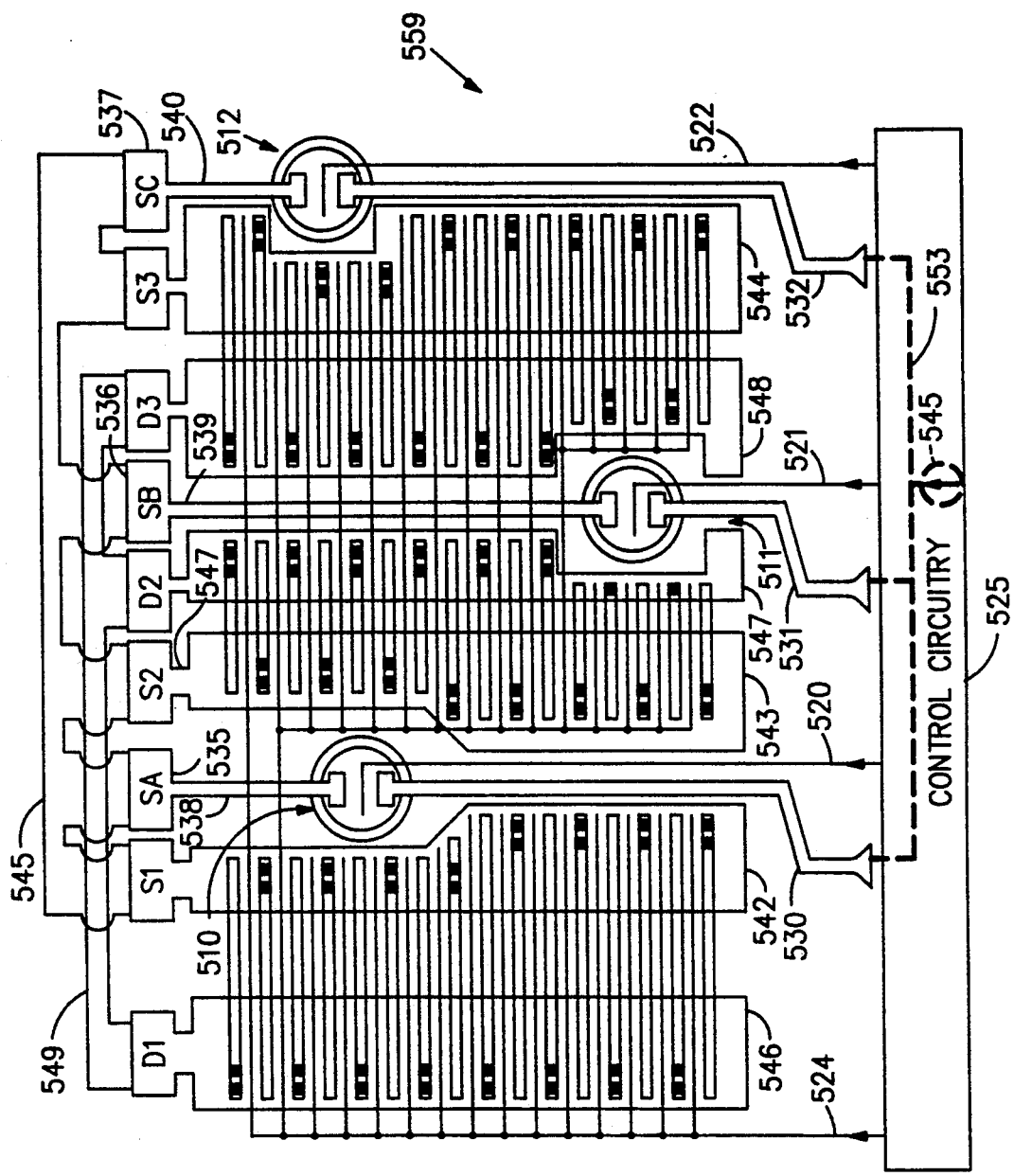
FIG. 10 is a top view of a novel circuit comprising a load transistor, three pilot transistors and control circuitry and the semiconductor layout of the circuit.
Figure 11:
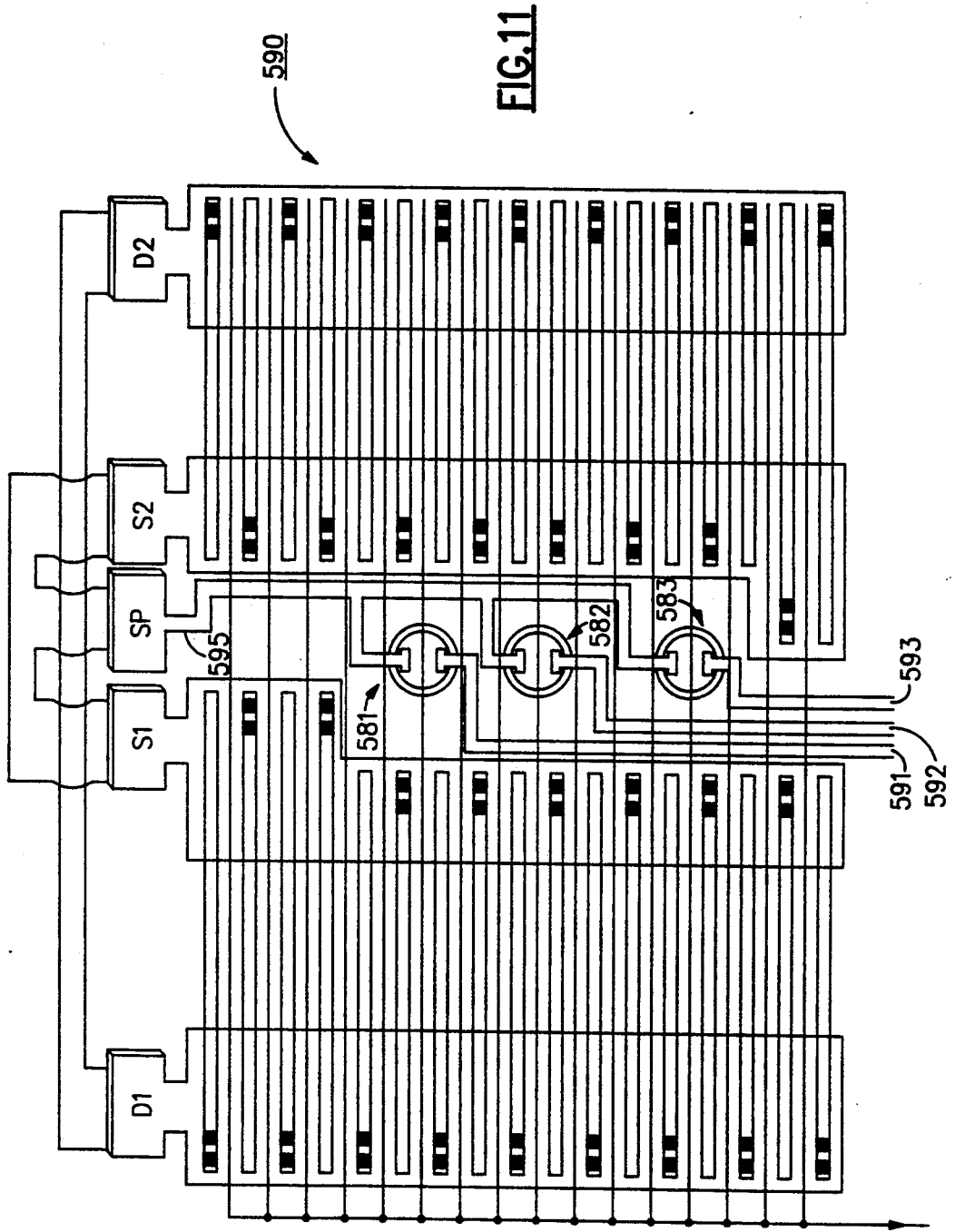
FIG. 11 is a top view of another novel circuit comprising a load transistor, three pilot transistors and control circuitry and the semiconductor layout of the circuit.
Figure 12:
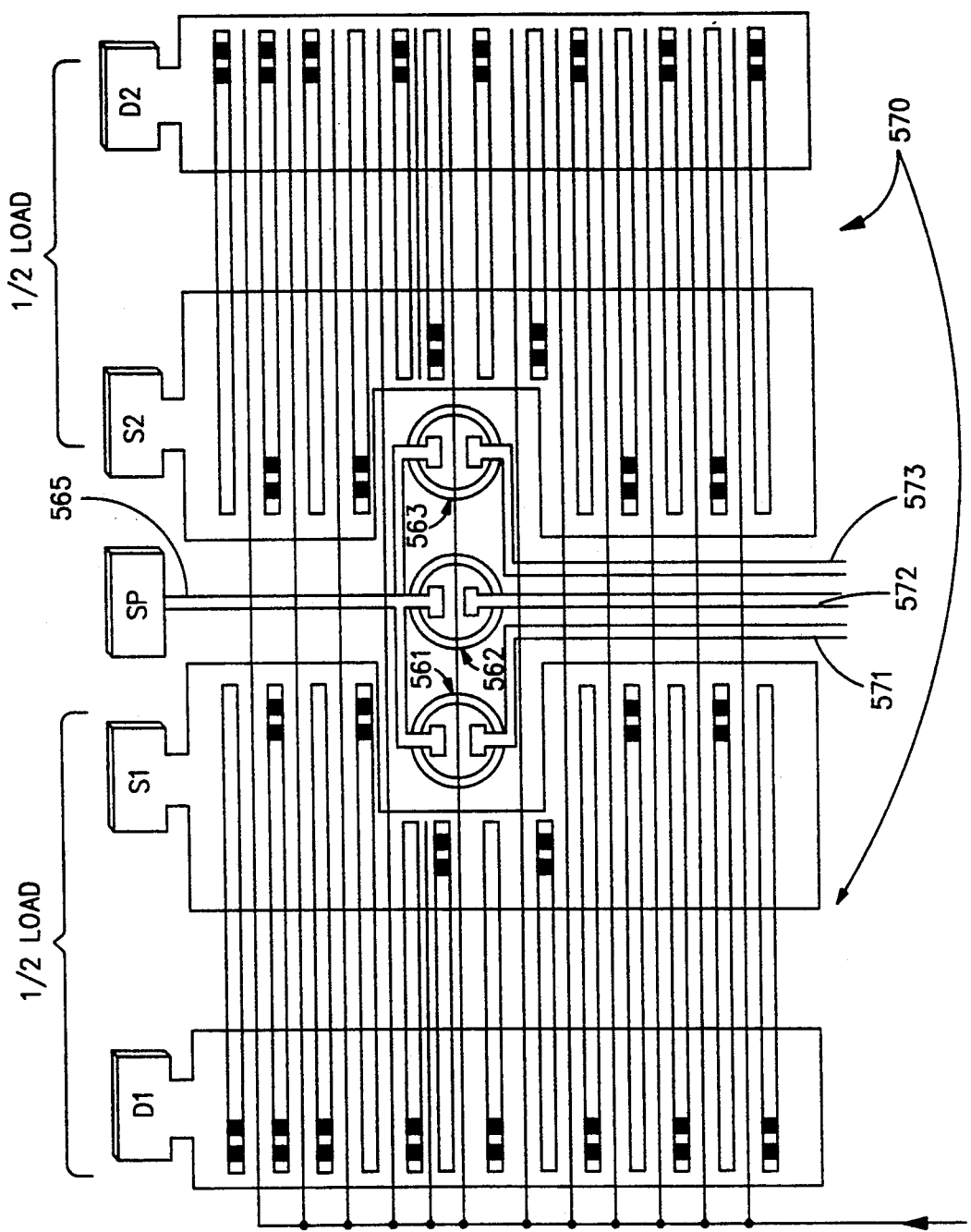
FIG. 12 is a top view of another novel circuit comprising a load transistor, three pilot transistors and control circuitry, and the semiconductor layout of the circuit.

FIGS. 10, 11 and 12 illustrate circuits which include more than one drain pilot transistor which are substantially surrounded by a respective load transistor. In FIG. 10, drain pilot transistors 510 and 511 are substantially surrounded by load transistor 559, and drain pilot transistor 512 is partially surrounded by load transistor 559. The pilot transistors are located at three separate locations within the load transistor to monitor the temperatures at these three locations. This arrangement is particularly useful when there are significant variations in temperature across the load transistor and it is desired to provide an average temperature compensation.

The drains of the pilot transistors 510, 511 and 512 are connected to control circuitry 525 by respective conductors 530, 531 or 532. The sources of pilot transistors 510, 511 and 512 are also connected to respective I/O pads 535, 536 and 537 (which are grounded) by respective conductors 538, 539 and 540. The gates of pilot transistors 510, 511 and 512 are connected to control circuitry 525 by respective polysilicon strips 520, 521 and 522. The three conductors for each pilot transistor subdivided the load transistor into portions. The load transistor portions are connected in parallel by common polysilicon gate strip 524, conductors 542, 543 and 544 in the metal two layer and associated conductor strip 545 for the sources, and conductors 546, 547 and 548 in the metal two layer and associated conductor strip 549 for the drains. To obtain an average of these temperature monitors, the drains of all three pilot transistors 510, 511 and 512 can be electrically connected to each other as indicated by broken lines 553, to yield a parallel connection of the three pilot transistors, and all the pilot drains can be supplied by a common current source 545. In this parallel connection, the gates of all three pilot transistors would also be common. The designs of the individual transistors forming load transistor 559 and the pilot transistors 510, 511 and 512 are the same as in FIGS. 6–8.

In the FIG. 11 arrangement, three drain pilot transistors 581, 582 and 583 are located adjacent to each other and substantially surrounded by load transistor 590 to attain the temperature of the load transistor and minimize any temperature differential between the pilot transistors. This is important when, for example, one or two of the pilot transistors are used as references to control the load current and one or two of the other pilot transistors are used as overcurrent and undercurrent detectors (described below), and all three pilot transistors should have nearly identical temperatures as each other to work in unison. Also, close temperature tracking with the load transistor is required for optimum performance. The pilot transistors 581, 582 and 583 are co-linear along a line which is perpendicular to the rows of individual transistors forming the load transistor 590. Because the pilot transistors are co-linear and next to each other, they readily attain substantially the same temperature as the surrounding load transistor and substantially the same temperature as each other. Also, all three pilot transistors 581, 582 and 583 have respective drain conductors 591, 592 and 593 which are parallel and adjacent to each other, and all three pilot transistors share a common source conductor 595. This arrangement minimizes the overall area required for both the load transistor and the pilot transistors and simplifies the layout of the load transistors because there is just one "pocket" for the pilot transistors, one narrow "channel" for the source conductor, and one narrow "channel" for the drain conductors. The transistor design for the individual transistor of the load transistor 590 and the pilot transistors 581, 582 and 583 is the same as that shown in FIG. 6–8.

In the FIG. 12 arrangement (which is an alternate arrangement to the preferred arrangement of FIG. 11), three drain pilot transistors 561, 562 and 563 are also adjacent to each other and substantially surrounded by load transistor 570 to closely track the temperature of the load transistor and avoid any temperature differential between the pilot transistors. The pilot transistors 561, 562 and 563 are co-linear along a line which is parallel to the rows of individual transistors forming the load transistor 570. Because the pilot transistors are co-linear and next to each other they readily attain substantially the same temperature as the surrounding load transistor and substantially the same temperature as each other. Also, all three pilot transistors 561, 562 and 563 have respective drain conductors 571, 572 and 573 which are parallel and adjacent to each other, and all three pilot transistors share a common source conductor 565. This arrangement minimizes the overall areas required for both the load transistor and the pilot transistors and simplifies the layout of the load transistor because there is just one "pocket" for the pilot transistors, one narrow "channel" for the source conductor, and one narrow "channel" for the drain conductors. The transistor designs for the individual transistors of the load transistors 570 and the pilot transistors 561, 562 and 563 are the same as that shown in FIGS. 6–8.

Figure 13:
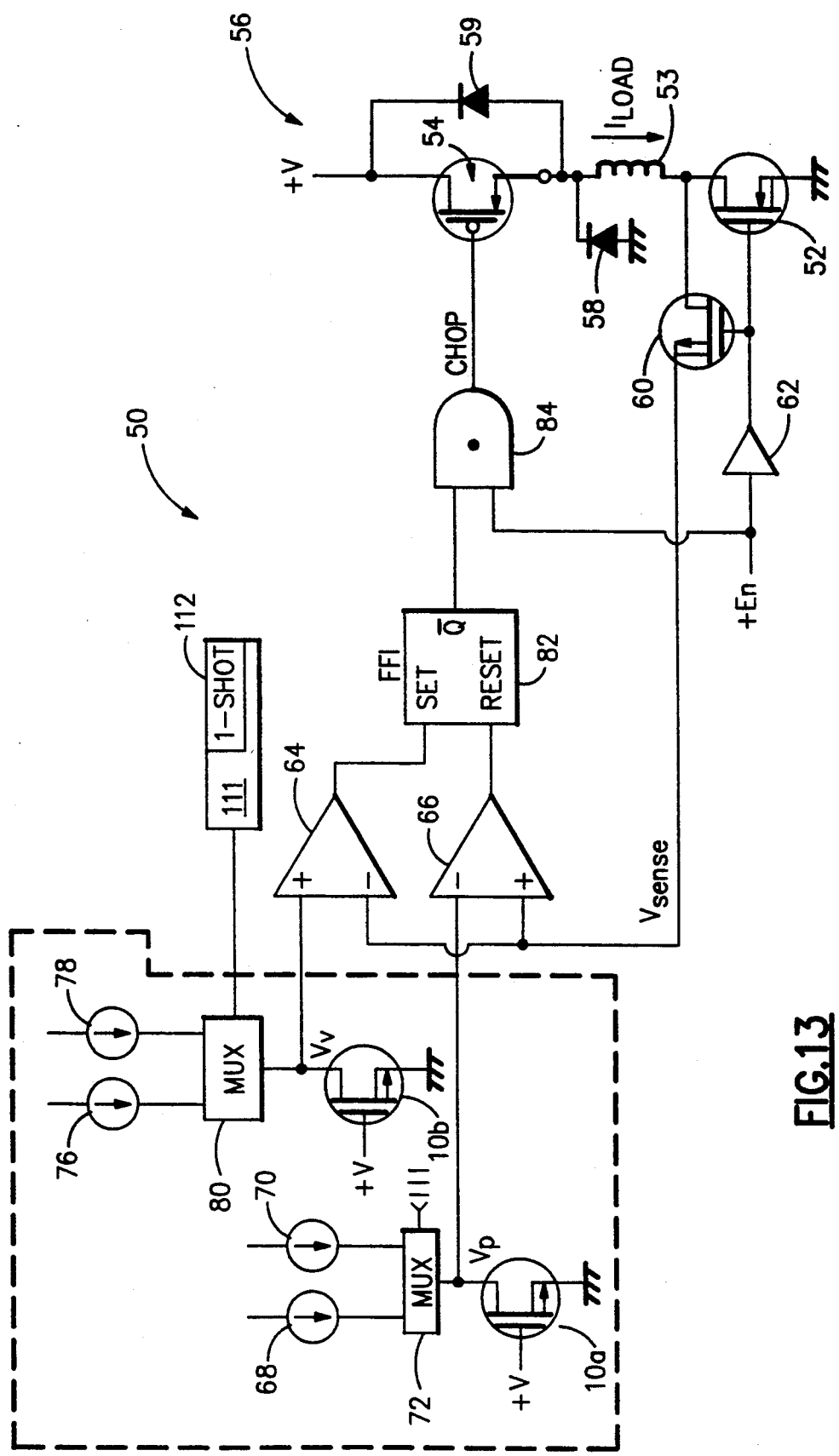
FIG. 13 is a circuit diagram of a novel controller and drive circuit for driving a solenoid at two levels of drive current.

FIG. 13 illustrates a novel circuit generally designated 50, utilizing two pilot transistors 10a and 10b similar to pilot transistor 17 or preferably pilot transistor 717 for controllably driving a solenoid within one or more ranges of current ("hysteretic control") such that the average load current within each range is controllable and unaffected by changes in temperature. For some applications, two ranges or levels of current are required, for example, a relatively high activation or "pick" level 65 (illustrated in FIG. 14) and a relatively low hold level 67 (also illustrated in FIG. 14). The relatively high activation level is used initially to quickly accelerate a solenoid core overcoming inertia and static friction. Then, the relatively low hold current is used to reduce the force of impact and holding force of the solenoid core.

Circuit 50 comprises an N-channel FET power or load transistor 52 which passes all the load current through a solenoid 53, and a P-channel FET chopping transistor 54 which controllably connects and disconnects a power supply 56 with solenoid 53. A diode 58 limits reverse polarity across solenoid 53 during switching and provides a current path when switch 54 is open. A diode 59 provides a current path to the power supply 56 when both transistors 54 and 52 are turned-off. An N-channel FET 60 is used to gate the instantaneous "sense" voltage developed across the load transistor 52 as a result of the load current passing through the on-resistance of the drain to source path of load transistor 52. The gating transistor 60 is enabled via a noninverting buffer 62. The sensed voltage is applied to a negative input of a comparator 64 and a positive input of a comparator 66, and compared to reference voltages developed across the temperature compensated drain pilot transistors 10a and 10b as follows.

Figure 21:
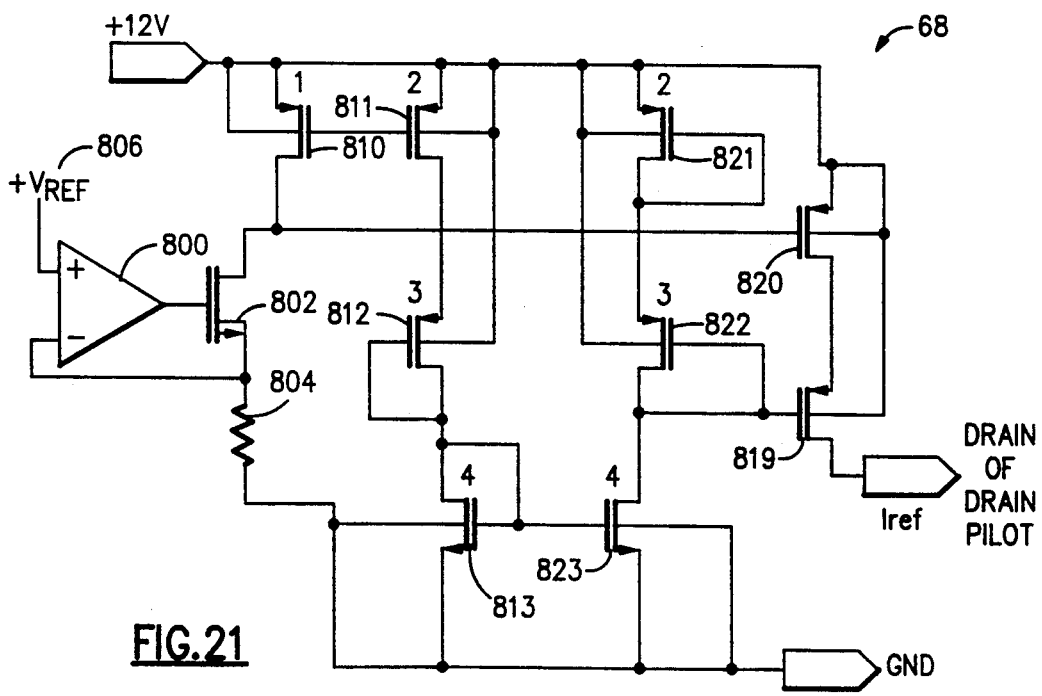
FIG. 21 is a circuit diagram of a current source that can be used in any of the foregoing electrical circuits.

At each level of drive current, the instantaneous drive current is maintained within a range or "window" based on the reference voltages. Two constant current sources 68 and 70 are alternately connected to the drain of pilot transistor 10a via a multiplexor 72. The circuitry which forms current source 68 is illustrated in detail in FIG. 21, (and the same circuitry can be used for all current sources referenced in this patent application). Current source 68 comprises an operational amplifier 800 whose output is connected to the gate of FET 802. The source of FET 802 is connected to a resistor 804, and the voltage across the resistor is fed back to the negative input of operational amplifier 800. The positive input of operational amplifier 800 is supplied by a source 806 of voltage (VRef). Thus, the current through resistor 804 equals the voltage of source 806 divided by the resistance of resistor 804. As described in more detail below, the current supplied at the output of current source 68 equals the current through resistor 804. Consequently, the output current is programmable by selection of the voltage of source 806 and/or the resistance of resistor 804. The remainder of current source 68, transistors 810-813 and 819-823, is a 1:1 current mirror to provide at the output equal current to that which flows through resistor 804. The 1:1 characteristic of the current mirror is established by transistors 820 and 810 which have identical gate geometries and are provided with the same gate and source voltages. The gate geometries of all of the transistors in the current mirror are indicated by the following table:

| Transistors | Length (microns) | Width (microns) |
|---|---|---|
| 810,820 | 8 | 800 |
| 811,821 | 8 | 48 |
| 812,822 | 5 | 30 |
| 813,823 | 5 | 40 |
| 819 | 5 | 500 |

This current source 68 can be provided on or off the chip, and as noted above, is programmable. If desired, the programmable source 806 of voltage can be used to provide two current output levels instead of the two separate current sources 68 and 70 and multiplexor 72.

Figure 14:
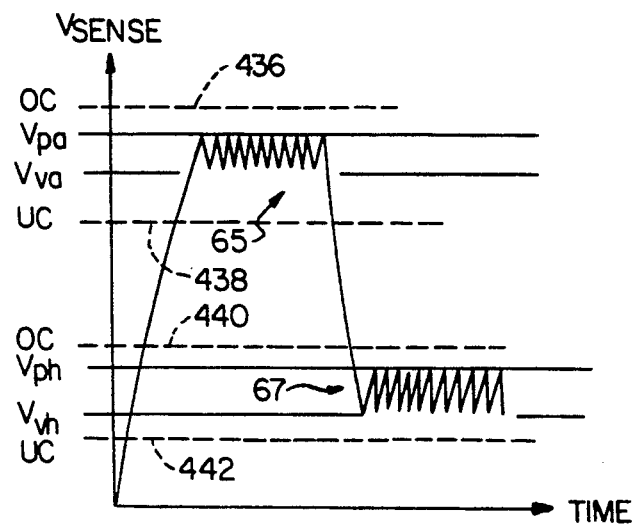
FIG. 14 is a graph illustrating the voltages sensed and reference voltages generated by the controller of FIG. 13 to control the drive currents to the solenoids.

The current source 68 is used to develop across pilot transistor 10a a relatively high or peak reference voltage, Vph, for the window for the relatively low hold current, and current source 70 is used to develop across pilot transistor 10a a relatively high or peak reference, Vpa, for the window for the relatively high activation current (see FIG. 14). The relatively high reference for either window is applied to the negative input of comparator 66. The output of comparator 66 is applied to an overriding reset input of a flip-flop 82. The Q output of flip-flop 82 is applied to an input of AND gate 84. The other input of AND gate 84 is supplied by the ENABLE signal of gate 62, and the output of AND gate 84 controls the chopping transistor 54. Thus, when the sensed voltage corresponding to the instantaneous load current exceeds the relatively high reference voltage at either level of load current, the comparator 66 goes high which resets the flip-flop 82. Consequently, the Q NOT output of flip-flop 82 goes high, the output of AND gate 84 goes high, and the chopping transistor 54 is shut off. With chopping transistor 54 shut off, the voltage from power supply 56 is blocked, and the current through solenoid 53 decays according to a discharging LR time constant of the series load circuit.

Similarly, two current sources 76 and 78 are applied to the drain of pilot transistor 10b via a multiplexor 80. Current source 76 develops across pilot transistor 10b a relatively low or valley reference voltage, Vvh, for the window for the relatively low hold current, and current source 78 develops across drain pilot 10b a relatively low or valley reference voltage, Vva, for the window for the relatively high activation current. The voltage developed across the drain pilot 10b is applied to the positive input of comparator 64. The output of comparator 64 is applied to the set input of flip flop 82. Consequently, when the instantaneous load current falls below the lower reference voltage developed across drain pilot 10b at either level of load current, comparator 64 sets flip flop 82, and the Q NOT output of flip flop 82 turns on chopping transistor 54 to connect power supply 56 to solenoid 53. As a result, the load current will increase according to a changing LR time constant of the load circuit. The load current increases until it exceeds the relatively high reference applied to the input of comparator 66 as described above, at which time, the power supply is again disconnected from the solenoid to repeat the cycle again. Thus, the load current is maintained within a range corresponding to the range between the relatively high and relatively low reference voltages of the respective window. By way of example, the difference between the relatively high and low reference voltages at each level is 100 millivolts.

Multiplexors 72 and 80 are controlled by a selector 111 to determine the time that the activation current is applied and the time that the hold current is applied. Selector 111 can be provided off chip by a microprocessor signal or on chip by hardware. Such hardware includes a one-shot 112 to determine the time that the activation current is applied before switching to the hold current. Selector 111 selects current sources 70 and 78 simultaneously, and then selects current sources 68 and 76 simultaneously to establish the appropriate windows.

The load current corresponding to each window is maintained with a high degree of precision by the precision of current sources 68, 70, 76 and 78, and the temperature tracking capability of pilot transistors 10a and 10b. As noted above, as the load transistor 52 heats-up due to the load current, the on-resistance of load transistor 52 increases. However, due to the proximity of pilot transistors 10a and 10b to load transistor 52 and the fact that the pilot transistors are scaled models of the load transistor, the pilot transistors 10a and 10b are likewise heated to the same temperature and exhibit a proportional increase in on-resistance. Consequently, the voltages developed across the pilot transistors due to the fixed current sources increase proportionally to the on-resistance of the load transistor, and the reference voltages are temperature compensated. Also, because the sensed voltage rises and falls between the two reference voltages at each level, the average load current at each level is substantially constant. This provides high precision as to the speeds of the solenoid core and associated moving parts at each level, and the electromagnetic force during travel and final force of impact. If the circuit of FIG. 13 were controlled by selector 111 to provide two levels of load current for driving a stepper motor coil, then the torque of the motor would likewise be closely controlled.

Figure 15:
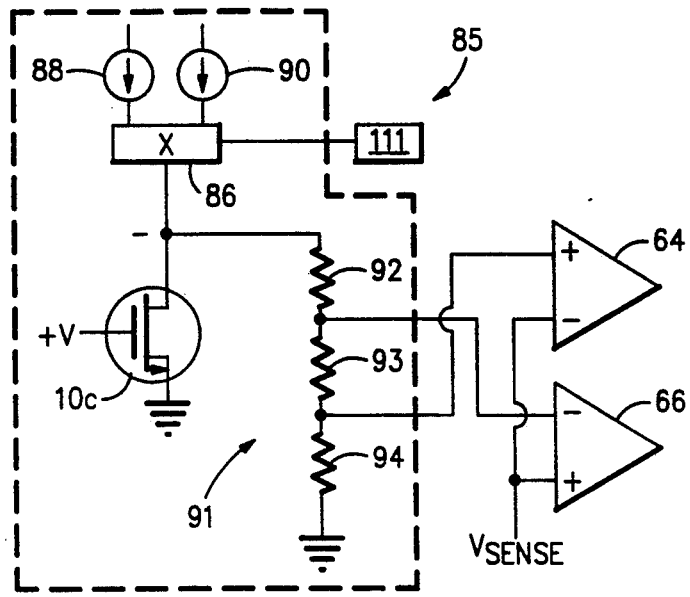
FIG. 15 is a circuit diagram of an alternate design to the circuitry of FIG. 13.

FIG. 15 illustrates a circuit 85 which also provides two levels of load current to solenoid 53, and differs from circuit 50 of FIG. 13 in the manner of generating the peak and valley reference voltages for each level of load current. Instead of using two drain pilot transistors as in circuit 50, circuit 85 uses a single drain pilot transistor 10c and a voltage divider 91 (or possibly a potentiometer) as follows to develop two reference voltages for each level of load current. Two current sources 88 and 90 are alternately applied via a multiplexor 86 to pilot transistor 10c. Current source 88 is used to develop the two reference voltages for the hold current and current source 90 is used to develop the two reference voltages for the activation current. When either current source 88 or 90 is applied to pilot transistor 10c, the resultant voltage is applied to the top of voltage divider 91. Voltage divider 91 comprises three series resistors 92, 93 and 94, and the voltage between resistors 92 and 93 is applied to the negative input of comparator 66 to provide the peak reference voltage and the voltage in between resistors 93 and 94 is applied to the positive input of comparator 64 to provide the valley reference voltage. Thus, the voltage divider 91 establishes the window at each level of load current based on the voltage developed by the current source 88 or 90 across pilot transistor 10c. The remainder of the circuit 85 operates as in circuit 50. The circuit 85 of FIG. 15 requires less circuitry than that of FIG. 14 but is not as precise as that of FIG. 14 because the resistors 92-94 are not as precise as the four current sources and two pilot transistors of circuit 50.

Figure 16:
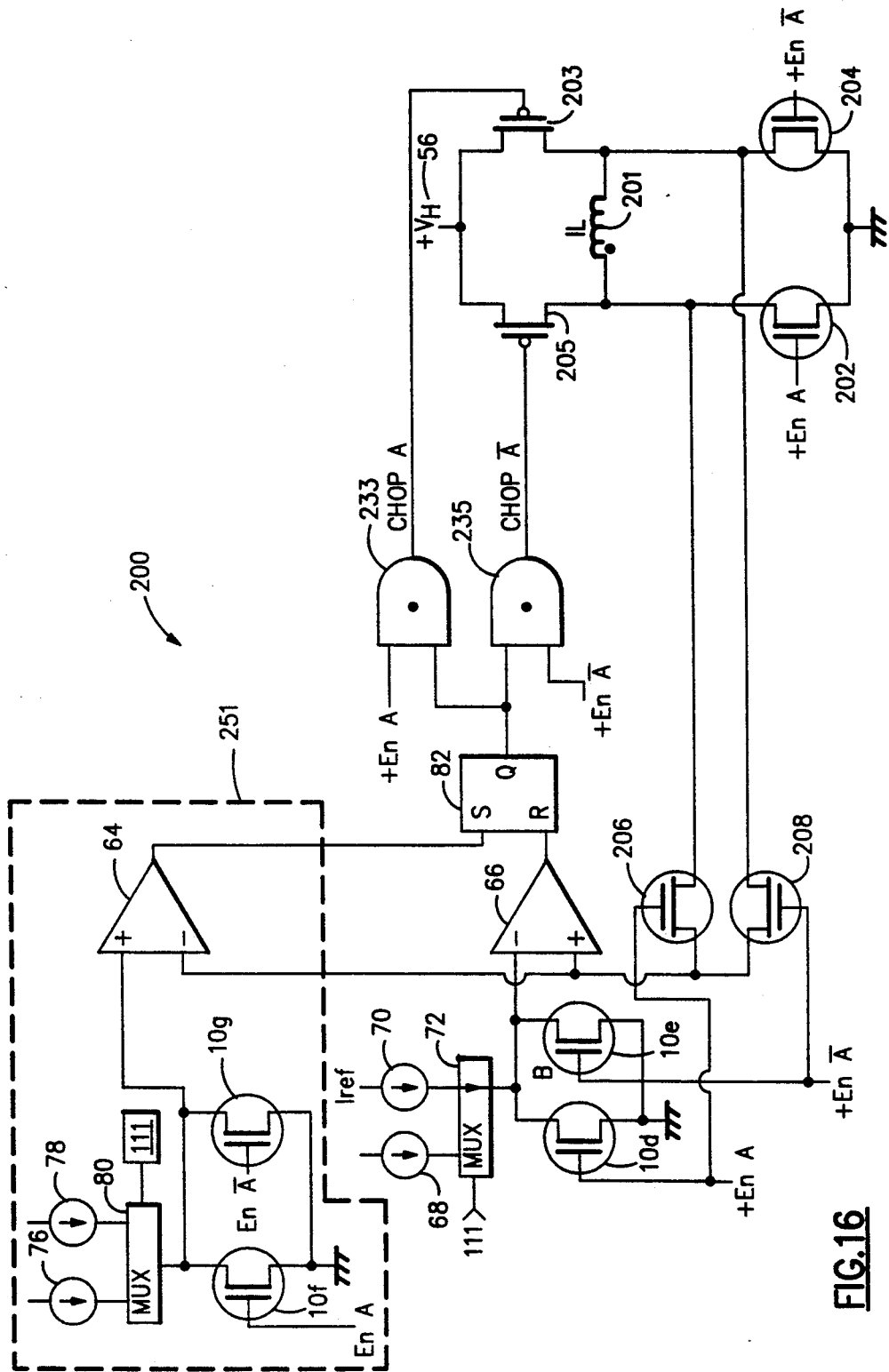
FIG. 16 is a circuit diagram of another novel controller and drive circuit for driving a solenoid at two levels of drive current in two directions at each level.

FIG. 16 illustrates a circuit 200 which permits a solenoid or motor coil 201 or transformer or other load to be driven at two different levels of load current as with the circuit 50 but in both directions. For example, circuit 200 is useful to drive an H-bridge transistor configuration to control motor speed and direction. In circuit 200, two load transistors 202 and 204 are connected to coil 201 on opposite sides thereof. To drive current through the coil in one direction, load transistor 202 is enabled by an "En A" signal, and to drive current through the coil in the other direction, load transistor 204 is enabled by an En A NOT signal. En A NOT is the compliment of En A except that both transistors 202 and 204 should never be on at the same instant. Chopping transistors 203 and 205 cooperate with load transistors 202 and 204, respectively, to controllably connect power supply 56 to coil 201 at the appropriate time. Each of the load transistors 202 and 204 has a respective gating transistor to apply the voltage developed across the on-resistance of the respective load transistor to the voltage comparators 64 and 66. Gating transistor 206 is enabled by En A at the same time as load transistor 202 and gating transistor 208 is enabled by En A NOT at the same time as load transistor 204. A drain pilot transistor 10d is provided for load transistor 202, connected to multiplexor 72 and enabled by Enable A, and a drain pilot transistor 10e is provided for load transistor 204, connected to multiplexor 72 and enabled by En A NOT. Similarly, a pilot transistor 10f is provided for load transistor 202, connected to multiplexor 80 and is enabled by En A, and a pilot transistor 10g is provided for load transistor 204, connected to multiplexor 80, and is enabled by En A NOT. When either En A or En A NOT is signalled, the reference voltages for each level of load current are developed and applied to comparators 64 and 66 as in circuit 50 of FIG. 13, and flip-flop 82 is set and reset as in circuit 50. However, in circuit 200, two AND gates 233 and 235 are provided (instead of the lone AND gate 84 of circuit 50); AND gate 233 has one input connected to the Q NOT output of flip-flop 82 and another input connected to receive Enable A and an output connected to control chopping transistor 203. AND gate 235 has one input connected to the Q NOT output of flip-flop 82 and another input connected to receive En A NOT and an output connected to control chopping transistor 205. Therefore, when load transistor 202 is enabled, so is gating transistor 206, pilot transistors 10d and 10f and And gate 233. Alternately, when load transistor 204 is enabled, so is gating transistor 208, pilot transistors 10e and 10g, and And gate 235. When either set of transistors and respective And gate are enabled, the circuit 200 operates as described above with reference to circuit 50. Thus, for current in each direction, two levels of load current are provided, and the current at each level is maintained within a respective window.

It should be noted that the operation of coil 201 in both directions does not require a doubling of the circuitry 50; only a single instance of multiplexors 72 and 80, current sources 68, 70, 76, and 78, comparators 66 and 64, and flip-flop 82 is required.

Figure 18:
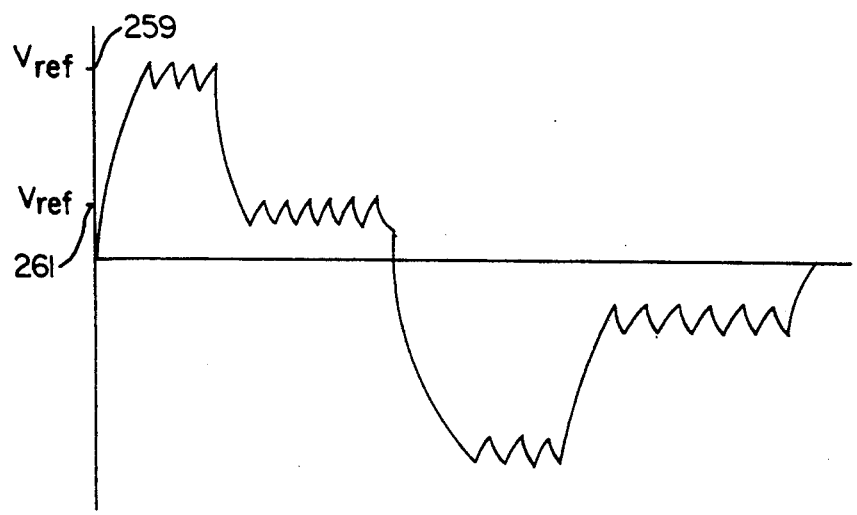
FIG. 18 is a graph illustrating the two levels of drive current in two directions generated by the circuitry of FIGS. 16 and 17.
Figure 17:
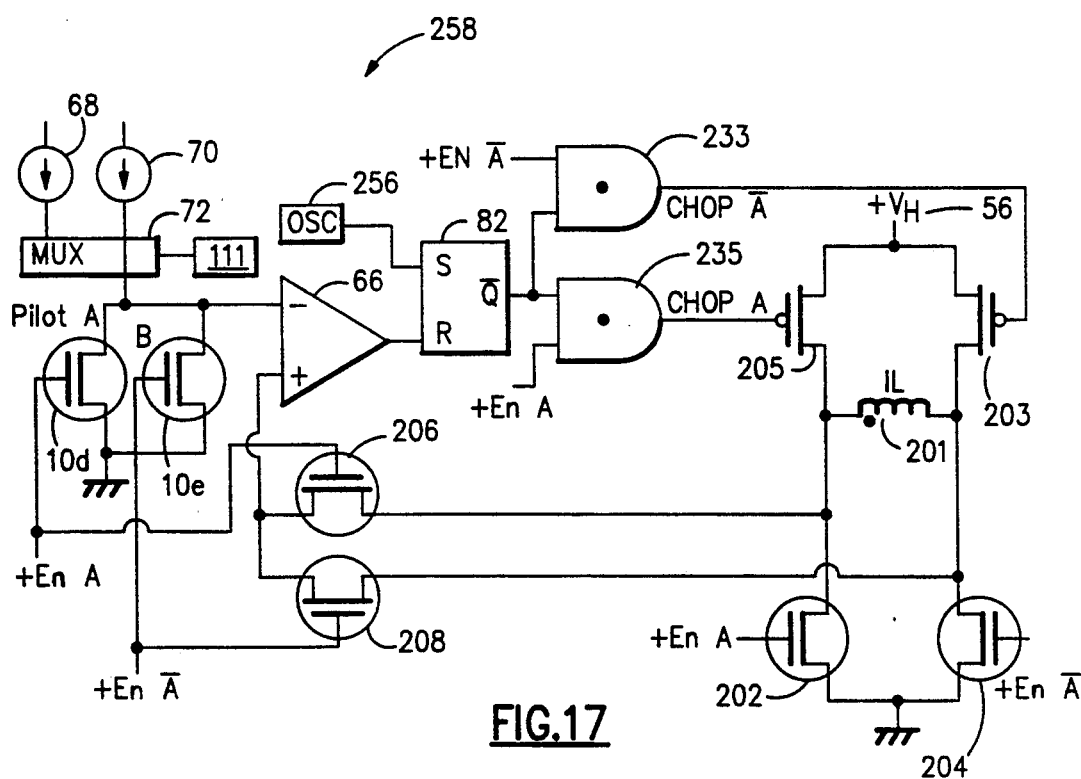
FIG. 17 is a circuit diagram of an alternative to the circuitry of FIG. 16.

FIG. 17 illustrates another control circuit 258 for driving coil 201 in both directions at two different levels of drive current. Circuit 258 differs from circuit 250 illustrated in FIG. 16 in that in circuit 258 an oscillator 256 substitutes for circuitry 251 to provide "forced-frequency control" and only one drain pilot voltage and comparator is required in circuit 258 of FIG. 17 for each level of drive current. A reference voltage 259 (FIG. 18) at the top of the acceptable range for the activation current is developed across pilot transistor 10d by current source 70 and applied to the negative input of comparator 66. Alternately, another reference voltage 261 at the top of the acceptable range for the hold current is developed across pilot transistor 10e by current source 68 and applied to the negative input of comparator 66. The sensed voltage from the enabled load transistor is gated to the positive input of comparator 66 by the respective gating transistor 206 or 208. Thus, when the sensed voltage exceeds the reference voltage, the flip-flop 82 is reset to disconnect the power supply 56 from the load, and the load current decays exponentially based on the LR time constant of the load circuit. However, when the oscillator 256 generates the next positive pulse, if the sensed voltage is less than the reference voltage, flip-flop 82 will be set ON and the power supply voltage is again connected to the load and the load current increases. This process repeats to maintain the load current at or slightly below the current corresponding to the reference voltage as illustrated in FIG. 18. FIG. 18 also illustrates that the two levels of load current are provided in each direction. As noted above the direction of current is determined by the En A or En A NOT signals and the level is determined by the selector 111 and multiplexor 72. The average of the resultant load current is controllable, except for the following factor. Because the series resistance of the load circuit varies with temperature, the LR time constants of the series circuit for decreasing and increasing load current vary. Consequently, the amount of decay of the load current varies when the power supply is disconnected, and the amount of increase of the load current varies when the power supply is reconnected. Because this variation is not great, the average load current is sufficiently controllable for many (but not all)

applications, and the circuit 258 of FIG. 17 requires less circuitry than the circuitry 200 of FIG. 16.

Figure 19:
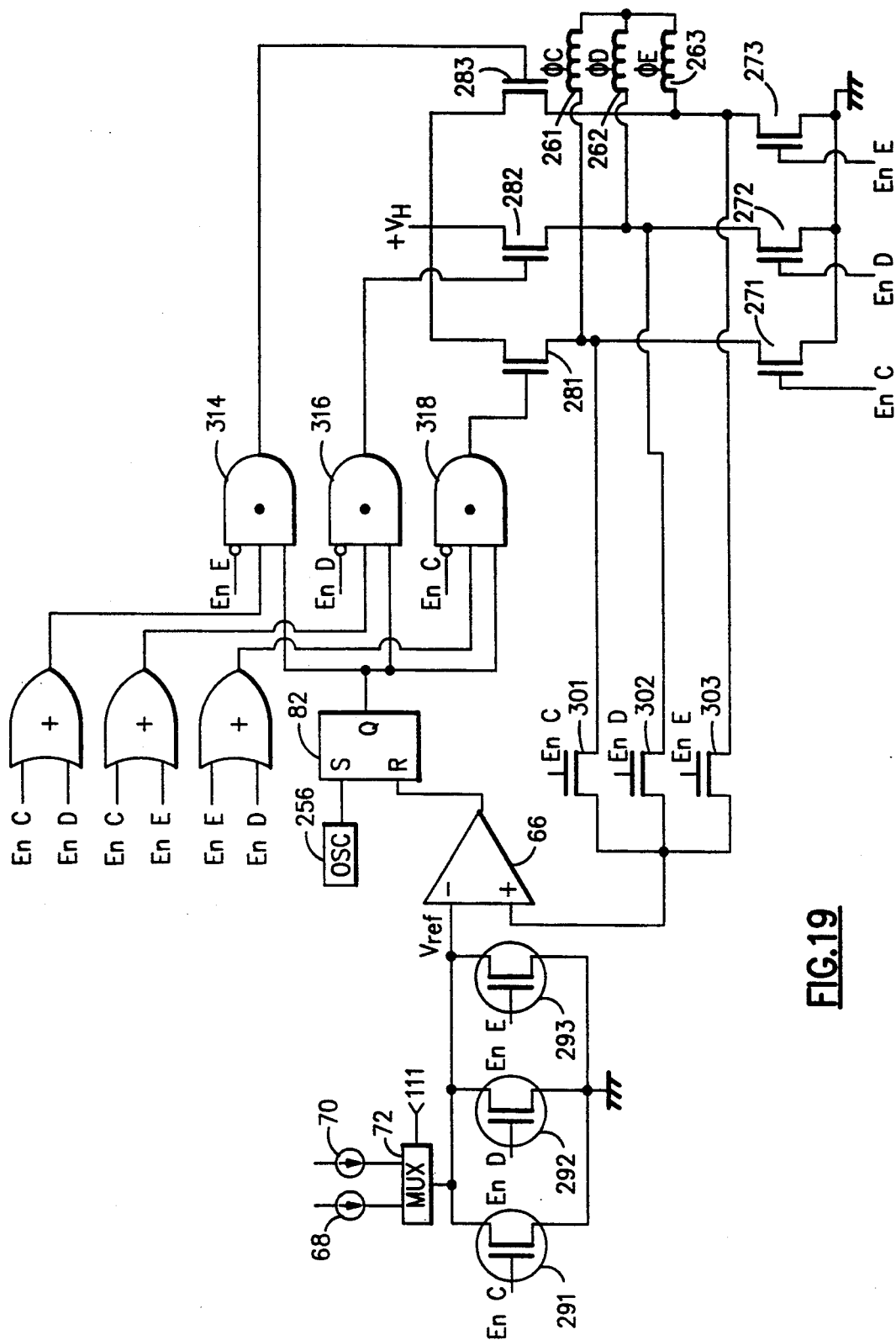
FIG. 19 is a circuit diagram of a novel controller and drive circuit for driving three coils in three phase relation in combinations of two coils in either direction.

FIG. 19 illustrates a circuit for controllably driving three coils 261-263 in three phase relation, usually in different combinations of two at a time. Load transistors 271-273 are provided to conduct load current when enabled. Each of the load transistors 271-273 has a respective drain pilot transistor 291-293 and a respective gating transistor 301-303. The respective load transistor, gating transistor and pilot transistor are enabled simultaneously to provide the corresponding reference voltage and sensed voltage to comparator 66. AND gates 314, 316 and 318 are enabled one at a time, and with the selection of one of the load transistors 271-273, creates a current path through the desired two coils. Because two current sources 68 and 70 are alternately coupled to the enabled pilot transistor, two levels of drive current similar to those illustrated in FIG. 18, are provided through the desired path.

These combinations and individual selections of loads are all controllably driven by three sets of load transistors, gating transistors, pilot transistors and AND gates and OR gates and one current source, one oscillator, and one flip flop. This provides great economy because only one additional AND and OR gate, and LOAD/GATING/PILOT transistors need be added for each coil added. Additional precision can be provided by replacing oscillator 256 with comparator 64 and current sources 76 and 78 of FIG. 16, and providing three more drain pilot transistors for respective load transistors 271-273. These additional pilot transistors would be connected in parallel and coupled to the additional current sources as in FIG. 16.

Figure 20:
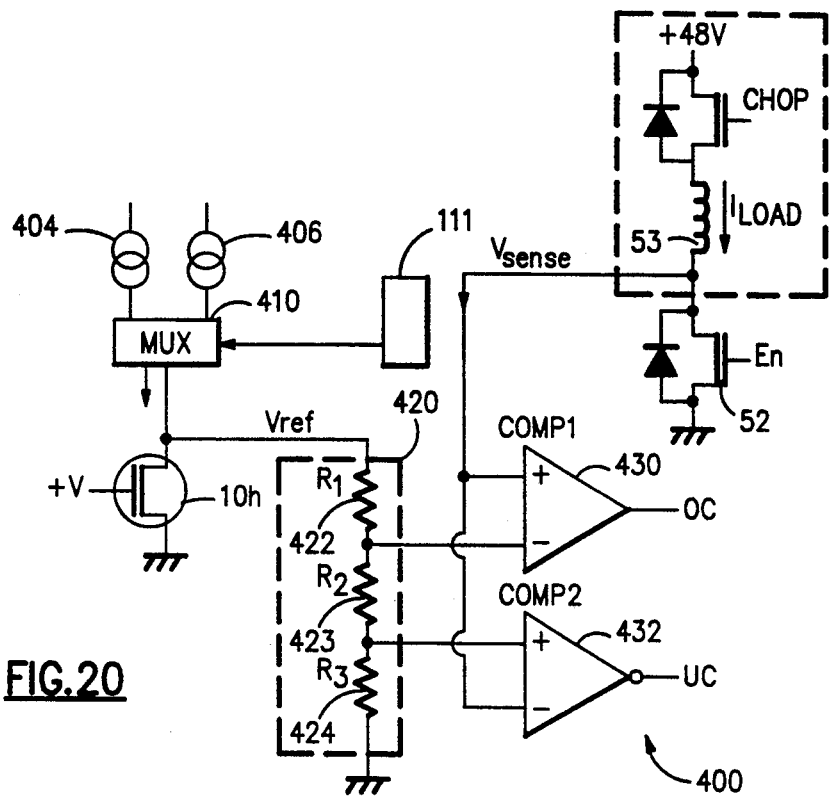
FIG. 20 is a circuit diagram of the overcurrent and undercurrent detector which develops the windows illustrated in FIG. 14 to detect overcurrent and undercurrent conditions at two levels of drive current.

FIG. 20 illustrates an overcurrent and undercurrent detector generally designated 400. Detector 400 comprises a drain pilot transistor 10h and is preferable arranged within a single load transistor along with two other pilot transistors which are used to control the load current. The arrangement of these three pilot transistors is preferably as in FIG. 11, and the control circuit is preferably circuit 50 of FIG. 13 (although any of the other control circuits will also cooperate well with detector 400).

Two fixed current sources 404 and 406 alternately supply current to the drain of drain pilot transistor 10h via multiplexor 410. Current source 404 is selected via multiplexor 410 for use in establishing reference detection levels for the relatively high activation current, and current source 406 is selected via multiplexor 410 for use in establishing reference detection levels for the relatively low hold current. The multiplexor is controlled by selector 111 which is used to determine when to accelerate and when to hold the solenoid as noted above.

The voltage at the drain of pilot transistor 10h, whether supplied by the current source 404 or current source 406, is applied to the top of a voltage divider 420. Voltage divider 420 comprises series resistors 422, 423, and 424. The total series resistance of resistors 422, 423, and 424 is many times larger than the on-resistance of pilot transistor 10h to prevent loading of the pilot transistor. By way of example, the resistances of resistors 422, 423 and 424 are 8,000, 3,000 and 200 ohms, respectively and the on-resistance of pilot transistor 402 is 150 ohms. The voltages developed between resistors 422 and 423 establishes an upper detection level for each of two levels of drive current and is applied to the negative input of a comparator 430. The voltages developed between resistors 423 and 424 establishes a lower detection level for each of the two levels of load current, and is applied to the positive input of a comparator 432. When the current source 404 is applied to pilot transistor 10h, then the upper and lower threshold voltages developed by voltage divider 420 form the detection levels for the relatively high activation current. These two detection levels, which correspond to the overcurrent and undercurrent conditions, respectively are illustrated as voltage levels 436 and 438 in FIG. 14. When the current source 406 is applied to pilot transistor 10h, then the voltage levels developed by voltage divider 420 form the upper and lower detection levels for the relatively low hold current. These two detection levels, which correspond to the overcurrent and undercurrent conditions, respectively are illustrated in FIG. 14 as voltage levels 440 and 442.

The other inputs to comparators 430 and 432 are supplied by the voltage developed at the drain of load transistor 430. When the drain voltage exceeds the overcurrent reference voltage for the respective level of load current, the comparator 430 outputs a positive pulse which can be read by a microprocessor or other correction circuitry not shown to indicate an overcurrent condition. When the voltage developed at the drain of load transistor 52 is less than the undercurrent reference voltage for the respective level of load current, the comparator 432 outputs a negative pulse which can be read by the microprocessor or other circuitry to indicate an undercurrent condition. During normal operation, the voltage at the drain of the load transistor 52 is between the overcurrent and undercurrent reference voltages for the respective level of load current, and neither comparator outputs a fault signal.

Because the voltage developed at the drain of the pilot transistor 10h is used to bias the voltage divider 420 and this voltage proportionally tracks temperature effects on the voltage developed at the drain of load transistor 52, the overcurrent and undercurrent detection levels evenly bracket the load current at the two levels of load current irrespective of temperature variations. In other words, as the load transistor heats-up and the on-resistance of the load transistor increases, the sensed voltage measured at the drain of the load transistor at each level increases due to the increased on-resistance of the load transistor, but likewise, the overcurrent and undercurrent reference voltages increase due to the increased on-resistance of the pilot transistor 10h that is thermally coupled with the load transistor (which is supplied by the fixed current source 404 or 406). Consequently, the overcurrent and undercurrent reference levels can be set close to the normal voltage range for each level of drive current, and small deviations from the normal range of each level can be detected despite variations in the sensed voltage.

FIG. 20 also illustrates by broken lines surrounding voltage divider 420 that voltage divider 420 is located externally to the integrated circuit that contains the remainder of detector 400. Being external, any or all of the resistors 422, 423 and 424 can be changed to re-position the detection levels in accordance with the desired level of drive current. Thus, if a different load is driven or conditions warrant different levels of drive current for the same load (using an externally programmable, on-chip or off-chip current source), then detector 400 can be adjusted to span the new drive levels. Only three I/O pins are required to interconnect the top reference voltage end of external resistor 422 to the drain of pilot transistor 402, the junction of external resistors 422 and 423 to the negative input of comparator 430 and the junction of external resistors 423 and 424 to the positive input of comparator 432; an external ground can be used for the other side of resistor 424. This provides a very wide range of possible reference levels, and requires only three external components and three I/O pins. Also, the precision is very high because all three external resistors are high precision resistors. However, if desired, resistor 422 can be integrated with the detector, and only resistors 423 and 424 provided externally. This reduces to two the number of I/O pins required, one I/O pin for each side of resistor 423, and the number of external resistors, resistors 423 and 424. This latter arrangement reduces slightly the range of detection reference levels that can be provided in view of the possible loading by the inputs to comparators 430 and 432 when large values of resistances 423 and 424 are required to establish reference levels which approach the voltage at the drain of pilot transistor 10h. Also, this latter arrangement using only two external resistors also decreases the precision because the resistance of integrated resistor 422 cannot be established precisely.

Detector 400 can also be used to sense the speed of a rotor of a motor or at least confirm that commutation of each stator coil has taken place (the rotor can be a permanent magnet). One such detector is associated with a load transistor for each stator coil (such as load transistor 202 and coil 201 of FIG. 16). In this example, there are two stator coils represented by A and B, and for rotation of the rotor the polarity of each coil is as follows:

$$\frac{A\ -B/A\ B}{-A\ -B/-A\ B}$$

An optical detector or Hall effect switch is used to sense the position of the rotor, and when the rotor is in position for commutation of the stator current through coil 201 to occur, drive current controller 200 reverses the current as follows. Just before the commutation, Enable A is high and Enable B is low, load transistor 202 is on and load transistor 203 is off. Pursuant to the commutation, Enable A is made low and Enable B is made high, and consequently, load transistor 202 is shut off and load transistor 203 is turned on. As a result, current through this stator coil will decay to zero and then rise to the full reverse level. The voltage across transistor 202 is also applied to comparators 430 and 432 to provide the sensed voltage (Vsense). Thus, this decay of the stator current to zero will trigger the undercurrent comparator 432 and cause an undercurrent signal to be transmitted. This signal confirms that the commutation has occurred. For this application, the undercurrent reference is set close to zero volts, so the under current signal also indicates the moment of commutation. The foregoing process is repeated for each commutation. Also, the physical geometry and electrical configuration of the motor are known. Thus, the rate at which the undercurrent signals are generated indicates the speed of the motor. It should be noted that the output of the optical sensor or hall effect switch is not as accurate as the undercurrent detector to indicate the speed of the motor because the variations in motor load and torque effect the closed loop reaction time. The undercurrent signal will not be viewed as indicating a failure of the current controller for a short duration after issuing the commute command. Rather it will be used to monitor a toggle to ensure that the stator field commutated when directed to do so.

Based on the foregoing, embodiments of the present invention have been disclosed. However, numerous substitutions and modifications can be made without deviating from the scope of the present invention. Therefore, the present invention has been disclosed by way of example and not limitation, and reference should be made to the following claims to determine the scope of the present invention.

We claim:

1. A circuit for detecting overcurrent and/or undercurrent conditions, said circuit comprising:
   a load transistor having an on-resistance which passes load current and varies with temperature;
   a pilot transistor integrated with said load transistor such that as said load transistor heats-up due to said load current passing through said on-resistance, said pilot transistor heats-up due to heat conduction from said load transistor, said pilot transistor having an on-resistance which varies proportionally or similarly to the on-resistance of said load transistor as said load transistor heats-up due to said load current;
   means for sensing a voltage across said on-resistance of said load transistor corresponding to the load current;
   means, including a current source coupled to said on-resistance of said pilot transistor, for generating a reference voltage either above or below an acceptable range of voltages sensed by the sensing means representing an acceptable range of load currents, whereby said reference voltage is compensated for temperature affects on said on-resistance of said load transistor, said reference voltage above said acceptable range representing an overcurrent reference and said reference voltage below said acceptable range representing an undercurrent reference; and
   comparator means, coupled to receive said sensed voltage and said reference voltage, for generating either an overcurrent signal when the sensed voltage is greater than said reference voltage and said reference voltage is an overcurrent reference or an undercurrent signal when said sensed voltage is less than said reference voltage and said reference voltage is an undercurrent reference.

2. A circuit as set forth in claim 1 wherein:
   the generating means includes a voltage divider coupled to said on-resistance of said pilot transistor for generating both said overcurrent reference voltage and said undercurrent reference voltage; and
   said comparator means generates the overcurrent signal when said sensed voltage is greater than said overcurrent reference voltage and the undercurrent signal when said sensed voltage is less than said undercurrent reference.

3. A circuit as set forth in claim 2 wherein:
   said voltage divider comprises at least two series resistors which develop two reference voltages, said overcurrent reference voltage and said undercurrent reference voltage; and
   said comparator means comprises first and second comparators, one input of said first comparators being supplied with said overcurrent reference voltage, one input of said second comparator being supplied with said undercurrent reference voltage, and the other input to each of said comparators being supplied with said sensed voltage, and the output of said first comparator providing said overcurrent signal and the output of said second comparator providing said undercurrent signal.

4. A circuit as set forth in claim 1 wherein the generating means further comprises a second current source coupled to said pilot transistor on-resistance to generate a different voltage across said pilot transistor on-resistance than said first current source develops across said pilot transistor on-resistance, and generates a second reference voltage as a result of said second current source, said second reference voltage being either above or below another acceptable range of sensed voltages representing another acceptable range of load currents; and further comprising means for selecting either of said current sources to couple to said pilot transistor on-resistance.

5. A circuit as set forth in claim 2 wherein said voltage divider is external to the integrated circuit containing said load transistor and said pilot transistor and is made of discrete components, whereby said components can be changed to change said reference voltage.

6. A circuit as set forth in claim 1 further comprising:

a second pilot transistor integrated with said load transistor such that as said load transistor heats-up due to said load current passing through said on-resistance, said second pilot transistor heats-up due to heat conduction from said load transistor, said second pilot transistor having an on-resistance which varies proportionally or similarly to the on-resistance of said load transistor as said load transistor heats-up due to said load current;

second means, including a current source coupled to the on-resistance of said second pilot transistor, for developing a second reference voltage;

second comparator means, coupled to receive said second reference voltage and the sensed voltage or a voltage based on or tracking the sensed voltage, for comparing the sensed voltage or said voltage based on or tracking the sensed voltage to the second reference voltage; and means, coupled to an output of said second comparator means, for controlling said load current based on the comparison provided by said second comparator means, whereby both the controlling means and the overcurrent and undercurrent signals track each other with changing temperature of said load transistor.

* * * * *